US011081538B2

United States Patent
Choi et al.

(10) Patent No.: US 11,081,538 B2
(45) Date of Patent: Aug. 3, 2021

(54) ORGANIC LIGHT EMITTING DIODE DISPLAY DEVICE HAVING A CIRCUIT STRUCTURE BURIED IN A SUBSTRATE THEREOF

(71) Applicant: SAMSUNG DISPLAY CO., LTD., Yongin-si (KR)

(72) Inventors: Byungseok Choi, Seoul (KR); Hyung-Il Jeon, Seoul (KR); Sang-Hee Jang, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/459,683

(22) Filed: Jul. 2, 2019

(65) Prior Publication Data
US 2020/0013843 A1     Jan. 9, 2020

(30) Foreign Application Priority Data

Jul. 3, 2018 (KR) .......................... 10-2018-0076818

(51) Int. Cl.
*H01L 27/32* (2006.01)
*H01L 51/00* (2006.01)

(52) U.S. Cl.
CPC ...... *H01L 27/3276* (2013.01); *H01L 51/0097* (2013.01)

(58) Field of Classification Search
CPC ............. H01L 27/3262; H01L 27/3276; H01L 27/1244; G02F 2001/133388
See application file for complete search history.

(56) References Cited

U.S. PATENT DOCUMENTS

| 6,055,034 A * | 4/2000 | Zhang | G02F 1/1339 349/151 |
| 6,472,256 B1 * | 10/2002 | Zhang | G02F 1/136204 257/E29.278 |
| 6,476,897 B1 * | 11/2002 | Watanabe | G02F 1/13454 349/139 |
| 2016/0211308 A1 * | 7/2016 | Lee | G09G 3/32 |
| 2017/0294425 A1 * | 10/2017 | Kim | H01L 51/0097 |
| 2018/0031890 A1 * | 2/2018 | Jung | G02F 1/133514 |
| 2019/0206976 A1 * | 7/2019 | Jeong | H01L 27/3262 |
| 2019/0252487 A1 * | 8/2019 | Wang | H01L 27/124 |
| 2020/0194468 A1 * | 6/2020 | Luo | H01L 27/1244 |
| 2020/0194470 A1 * | 6/2020 | Wang | H01L 27/1244 |

FOREIGN PATENT DOCUMENTS

KR   10-2017-0116632   10/2017

* cited by examiner

*Primary Examiner* — Bilkis Jahan
*Assistant Examiner* — Victor V Barzykin
(74) *Attorney, Agent, or Firm* — F. Chau & Associates, LLC

(57) ABSTRACT

An organic light emitting diode ("OLED") display device includes a substrate having a display region including a plurality of sub-pixel regions. A peripheral region at least partially surrounds the display region. A sub-pixel structure is disposed in each of the plurality of sub-pixel regions on the substrate. A circuit structure is disposed within the substrate in the sub-pixel region, and is located adjacent to the peripheral region.

19 Claims, 15 Drawing Sheets

US 11,081,538 B2

ORGANIC LIGHT EMITTING DIODE DISPLAY DEVICE HAVING A CIRCUIT STRUCTURE BURIED IN A SUBSTRATE THEREOF

CROSS-REFERENCE TO RELATED APPLICATION(S)

This application claims priority under 35 USC § 119 to Korean Patent Applications No. 10-2018-0076818, filed on Jul. 3, 2018 in the Korean Intellectual Property Office (KIPO), the contents of which are incorporated by reference herein in their entirety.

TECHNICAL FIELD

The present disclosure relates to an organic light emitting display device and, more particularly, an organic light emitting display device having a circuit structure buried in a substrate thereof.

DISCUSSION OF THE RELATED ART

Flat panel display ("FPD") devices are widely used in electronic devices because the FPD devices are lightweight and thin compared to conventional display devices such as cathode-ray tube ("CRT") display devices. Typical examples of the FPD device are a liquid crystal display ("LCD") device and an organic light emitting diode ("OLED") display device.

Recently, flexible OLED display device have been developed. These flexible OLED display devise may be bent, folded, or rolled without causing damage thereto. These flexible OLED display devices may include lower and an upper substrates, which are made of flexible materials. For example, the lower substrate may include a flexible substrate, and the upper substrate may have a thin film encapsulation structure. Here, the thin film encapsulation structure may have a structure where an inorganic layer and an organic layer are alternately stacked. Meanwhile, a plurality of wirings, a gate driving unit, etc. may be disposed in a dead space (e.g., a peripheral region) of the flexible OLED display device. The wirings, the gate driving unit, and semiconductor elements disposed in a display region may be located at a same layer. In this case, the dead space of the flexible OLED display device may be increased as a result of the wirings, gate driving unit, etc.

SUMMARY

An organic light emitting diode ("OLED") display device includes a substrate having a display region including a plurality of sub-pixel regions. A peripheral region at least partially surrounds the display region. A sub-pixel structure is disposed in each of the plurality of sub-pixel regions on the substrate. A circuit structure is disposed within the substrate in the sub-pixel region, and is located adjacent to the peripheral region.

An OLED display device includes a substrate having a display region including a plurality of sub-pixel regions. A peripheral region at least partially surrounds the display region. A sub-pixel structure is disposed within each of the plurality of sub-pixel regions on the substrate. A circuit structure is disposed within the substrate in the sub-pixel region, and is located adjacent to the peripheral region. A power supply wiring is disposed in the peripheral region on the substrate. A connection pattern is disposed on the power supply wiring. A block structure is disposed in the peripheral region on the substrate.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Hereinafter, exemplary embodiments of the present inventive concept will be explained in detail with reference to the accompanying drawings.

Figure 1:
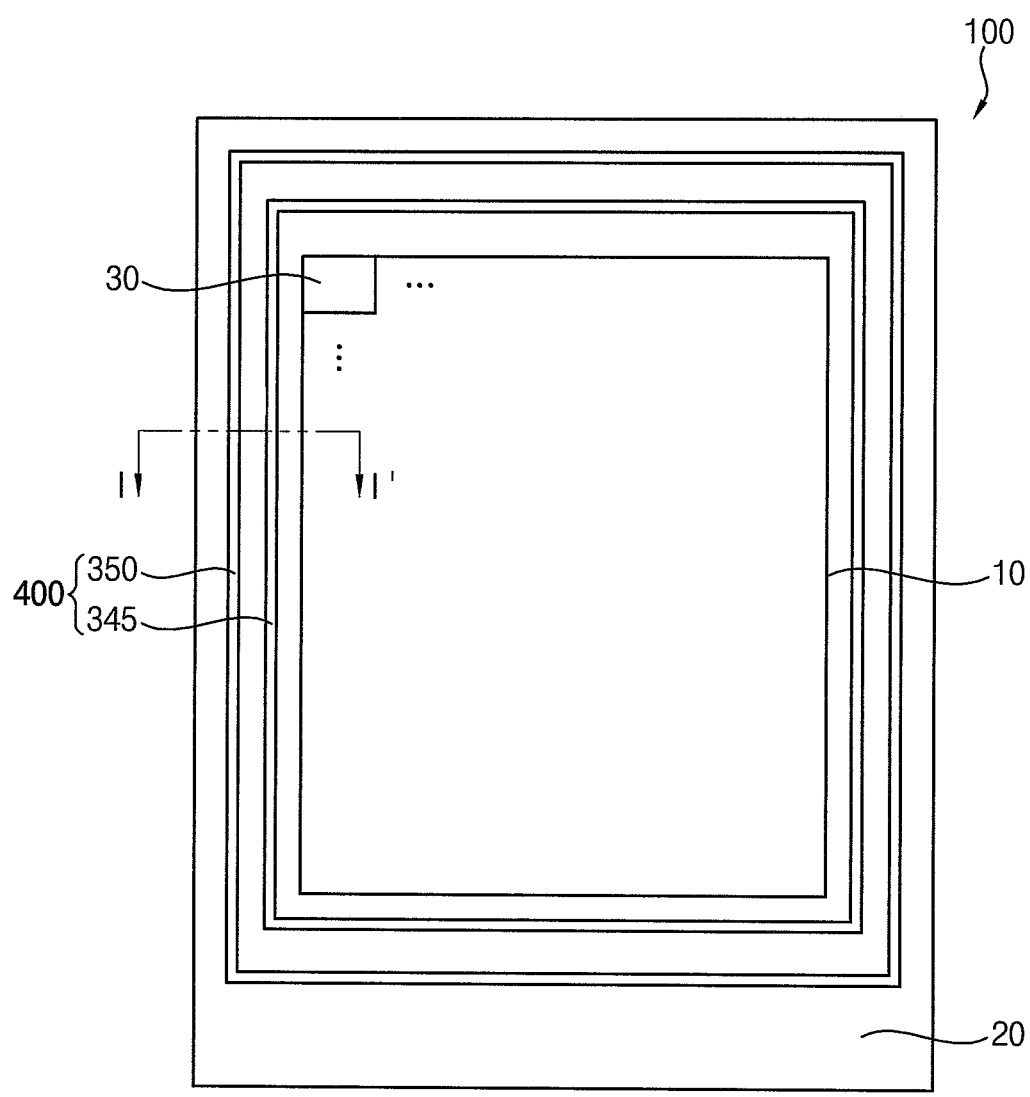
FIG. 1 is a plan view illustrating an organic light emitting diode ("OLED") display device in accordance with exemplary embodiments of the present inventive concept.

FIG. 1 is a plan view illustrating an organic light emitting diode ("OLED") display device in accordance with exemplary embodiments of the present inventive concept.

Referring to FIG. 1, an OLED display device 100 may include a display region 10 and a peripheral region 20 at least partially surrounding the display region 10. Here, the display region 10 may include a plurality of sub-pixel regions 30 disposed therein. The plurality of sub-pixel regions 30 may be entirely arranged in a matrix shape within the display region 10. For example, no sub-pixel regions 30 might be located outside of the display region 10.

Figure 2:
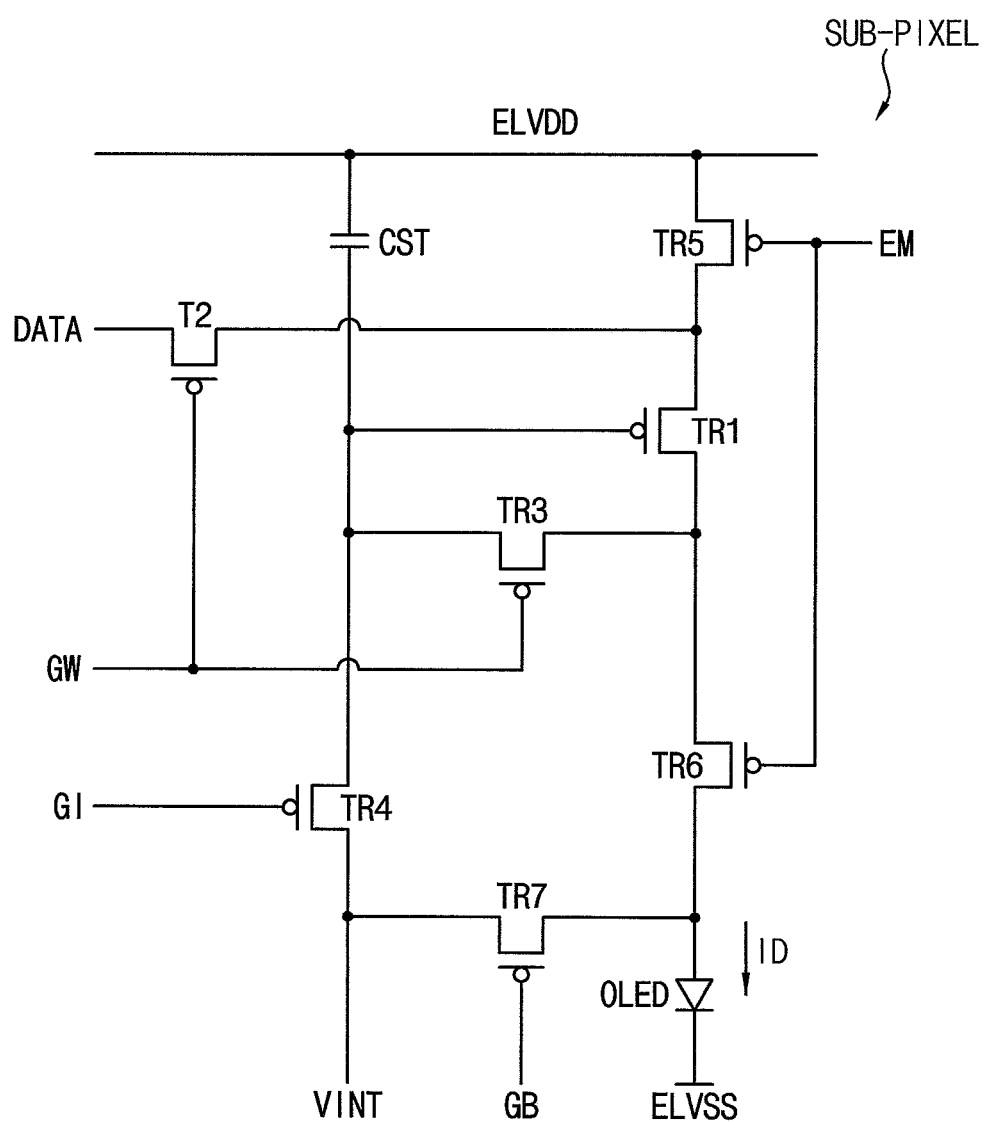
FIG. 2 is a circuit diagram illustrating a sub-pixel disposed in a sub-pixel circuit region of FIG. 1.

A sub-pixel of FIG. 2 (e.g., a sub-pixel structure 200 of FIG. 3) may be disposed in each of the sub-pixel regions 30 of the display region 10. An image (or a displaying image) may be displayed in the display region 10 by the operation of the sub-pixel. Wirings (e.g., gate signal wirings, data signal wirings, power supply wirings, etc.), a circuit structure (e.g., a gate driving unit, a data driving unit, etc.), and a block structure 400, etc. may be disposed in the peripheral region 20. Here, the wirings and the circuit structure may be electrically connected to the sub-pixel, and the block structure 400 may include a first block pattern 345 and a second block pattern 350.

According to exemplary embodiments of the present inventive concept, the first block pattern 345 may be disposed in the peripheral region 20 that is located adjacent to a boundary of the display region 10 and the peripheral region 20, and the first block pattern 345 may at least partially surround the sub-pixels. The second block pattern 350 may at least partially surround the first block pattern 345, and a height of the second block pattern 350 may be greater than a height of the first block pattern 345. For example, the first block pattern 345 might not be in contact with the second block pattern 350, and the first block pattern 345 and the second block pattern 350 may extend parallel to each other. The block structure 400 may block a leakage of a second thin film encapsulation layer included in a thin film encapsulation structure, which will be described below. In addition, as the OLED display device 100 includes a flexible substrate and the thin film encapsulation structure, the OLED display device 100 may serve as a flexible OLED display device.

According to exemplary embodiments of the present inventive concept, a shape of each of the display region 10, the sub-pixel regions 30, and the peripheral region 20 of FIG. 1 has a planar shape of a tetragon, but the present invention is not limited thereto. For example, the shape of each of the display region 10, the sub-pixel regions 30, and the peripheral region 20 may have a planar shape of a triangle, a planar shape of a diamond, a planar shape of a polygon, a planar shape of a circle, a planar shape of an athletic track, or a planar shape of an ellipse.

FIG. 2 is a circuit diagram illustrating a sub-pixel disposed in a sub-pixel circuit region of FIG. 1

Referring to FIG. 2, sub-pixels SUB-PIXEL may be disposed in the sub-pixel regions 30 of the OLED display device 100, respectively. Each sub-pixel SUB-PIXEL may include an OLED (a sub-pixel structure 200 of FIG. 3), first, second, third, fourth, fifth, sixth, and seventh transistors (TR1, TR2, TR3, TR4, TR5, TR6, and TR7) and a storage capacitor CST, etc.

The OLED may emit light based on a driving current ID. The OLED may include a first terminal and a second terminal. According to exemplary embodiments of the present inventive concept, the second terminal of the OLED receives a low power supply voltage ELVSS. For example, the first terminal of the OLED is an anode terminal, and the second terminal of the OLED is a cathode terminal. Alternatively, the first terminal of the OLED may be a cathode terminal, and the second terminal of the OLED may be an anode terminal. According to exemplary embodiments of the present inventive concept, the anode terminal of the OLED may correspond to a lower electrode 290 of FIG. 3, and the cathode terminal of the OLED may correspond to the upper electrode 340 of FIG. 3.

Figure 3:
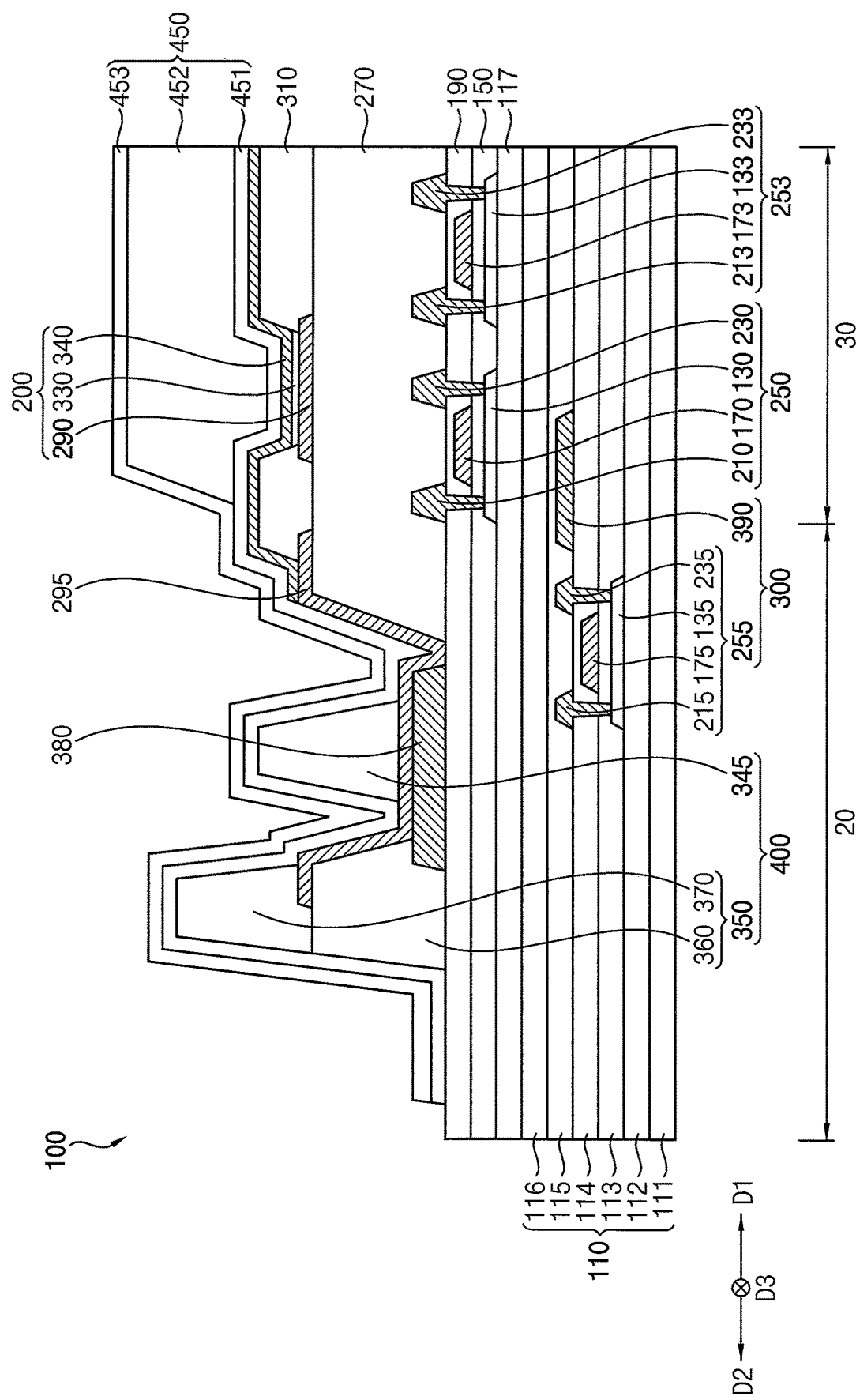
FIG. 3 is a cross-sectional view taken along a line I-I' of FIG. 1.

The first transistor TR1 (e.g., corresponding to a driving transistor 253 illustrated in FIG. 3) may include a gate terminal, a first terminal, and a second terminal. According to exemplary embodiments of the present inventive concept, the first terminal of the first transistor TR1 is a source terminal, and the second terminal of the first transistor TR1 is a drain terminal. Alternatively, the first terminal of the first transistor TR1 may be a drain terminal, and the second terminal of the first transistor TR1 may be a source terminal.

The driving current ID may be generated by the first transistor TR1. According to exemplary embodiments of the present inventive concept, the first transistor TR1 operates in a saturation region. In this case, the first transistor TR1 may generate the driving current ID based on a voltage difference of the gate terminal and the source terminal, and a gradation may be implemented based on the amount of the driving current ID generated by the first transistor TR1. Alternatively, the first transistor TR1 operates in a linear region. In this case, a gradation may be implemented based on the amount of time during which the first transistor TR1 provides the driving current ID to the OLED within one frame.

The second transistor TR2 may include a gate terminal, a first terminal, and a second terminal. A gate signal GW may be applied to the gate terminal of the second transistor TR2. The first terminal of the second transistor TR2 may receive a data signal DATA. The second terminal of the second transistor TR2 may be connected to the first terminal of the first transistor TR1. According to exemplary embodiments of the present inventive concept, the first terminal of the second transistor TR2 is a source terminal, and the second terminal of the second transistor TR2 is a drain terminal. Alternatively, the first terminal of the second transistor TR2 may be a drain terminal, and the second terminal of the second transistor TR2 may be a source terminal.

The second transistor TR2 may provide the data signal DATA to the first terminal of the first transistor TR1 while the gate signal GW is activated. In this case, the second transistor TR2 operates in a linear region.

The third transistor TR3 (e.g., a switching transistor 250) may include a gate terminal, a first terminal, and a second terminal. The gate terminal of the third transistor TR3 may receive a gate signal GW. The first terminal of the third transistor TR3 may be connected to the gate terminal of the first transistor TR1. The second terminal of the third transistor TR3 may be connected to the second terminal of the first transistor TR1. For example, the gate signal GW may be generated from a gate driving unit, and the gate signal GW may be applied to the gate terminal of the third transistor TR3 through a gate signal wiring. According to exemplary embodiments of the present inventive concept, the first terminal of the third transistor TR3 is a source terminal, and the second terminal of the third transistor TR3 is a drain terminal. Alternatively, the first terminal of the third transistor TR3 may be a drain terminal, and the second terminal of the third transistor TR3 may be a source terminal.

The third transistor TR3 may connect the gate terminal of the first transistor TR1 to the second terminal of the first transistor TR1 while the gate signal GW is activated. In this case, the third transistor TR3 may operate in a linear region. For example, the third transistor TR3 may form a diode connection of the first transistor TR1 while the gate signal GW is activated. A voltage difference, which corresponds to a threshold voltage of the first transistor TR1, between the first terminal of the first transistor TR1 and the gate terminal of the first transistor TR1 may occur due to the diode connection of the first transistor TR1. As a result, a sum voltage of the data signal DATA provided to the first terminal of the first transistor TR1 and the voltage difference (e.g., the threshold voltage) may be applied to the gate terminal of the first transistor TR1 while the gate signal GW is activated. Thus, the data signal DATA may be compensated as much as the threshold voltage of the first transistor TR1. The compensated data signal DATA may be applied to the gate terminal of the first transistor TR1. The driving current ID may be made more uniform by reducing an affect caused by the threshold voltage of the first transistor TR1.

An input terminal of an initialization voltage wiring (e.g., an initialization voltage wiring 390 of FIG. 3) applied to an initialization voltage VINT is connected to a first terminal of the fourth transistor TR4 and a first terminal of the seventh transistor TR7, and an output terminal of the initialization voltage wiring is connected to a second terminal of the fourth transistor TR4 and a first terminal of the storage capacitor CST.

The fourth transistor TR4 may include a gate terminal, the first terminal, and the second terminal. The gate terminal of the fourth transistor TR4 may receive a data initialization signal GI. The initialization voltage VINT may be applied to the first terminal of the fourth transistor TR4. The second terminal of the fourth transistor TR4 may be connected to the gate terminal of the first transistor TR1. According to exemplary embodiments of the present inventive concept, the first terminal of the fourth transistor TR4 is a source terminal, and the second terminal of the fourth transistor TR4 is a drain terminal. Alternatively, the first terminal of the fourth transistor TR4 may be a drain terminal, and the second terminal of the fourth transistor TR4 may be a source terminal.

The fourth transistor TR4 may apply the initialization voltage VINT to the gate terminal of the first transistor TR1 while the data initialization signal GI is activated. In this case, the fourth transistor TR4 may operate in the linear region. Thus, the fourth transistor TR4 may initialize the gate terminal of the first transistor TR1 as the initialization voltage VINT while the data initialization signal GI is activated. According to exemplary embodiments of the present inventive concept, a voltage level of the initialization voltage VINT is sufficiently lower than a voltage level of the data signal DATA maintained by the storage capacitor CST in a previous frame. The initialization voltage VINT may be applied to the gate terminal of the first transistor TR1 that is a P-channel metal oxide semiconductor ("PMOS") type transistor. According to exemplary embodiments of the present inventive concept, a voltage level of the initialization voltage VINT is sufficiently higher than the voltage level of the data signal DATA maintained by the storage capacitor CST in a previous frame. The initialization voltage VINT may be applied to the gate terminal of the first transistor TR1 that is an N-channel metal oxide semiconductor ("NMOS") type transistor.

According to exemplary embodiments of the present inventive concept, the data initialization signal GI is identical to the gate signal GW advanced by one horizontal time period. For example, the data initialization signal GI that is applied to sub-pixels located in a (n)th row among a plurality of sub-pixels included in the OLED display device 100 (where n is an integer of 2 or more) may be substantially a same as the gate signal GW that is applied to sub-pixels located in a (n−1)th row among a plurality of the sub-pixels. Thus, the data initialization signal GI that is activated may be applied to the sub-pixels located in the (n)th row among the sub-pixels by applying the gate signal GW that is activated to the sub-pixels located in the (n−1)th row among the sub-pixels. As a result, the gate terminal of the first transistor TR1 included in the sub-pixels located in the (n)th row among the sub-pixels may be initialized as the initialization voltage VINT when the data signal DATA is applied to sub-pixels located in the (n−1)th row among the sub-pixels.

The fifth transistor TR5 may include a gate terminal, a first terminal, and a second terminal. A light emission signal EM may be applied to the gate terminal of the fifth transistor TR5. A high power supply voltage ELVDD may be applied to the first terminal of the fifth transistor TR5. The second terminal of the fifth transistor TR5 may be connected to the first terminal of the first transistor TR1. According to exemplary embodiments of the present inventive concept, the first terminal of the fifth transistor TR5 is a source terminal, and the second terminal of the fifth transistor TR5 is a drain terminal. According to exemplary embodiments of the present inventive concept, the first terminal of the fifth transistor TR5 may be a drain terminal, and the second terminal of the fifth transistor TR5 may be a source terminal.

The fifth transistor TR5 may apply the high power supply voltage ELVDD to the first terminal of the first transistor TR1 while the light emission signal EM is activated. On the other hand, the fifth transistor TR5 does not apply the high power supply voltage ELVDD while the light emission signal EM is inactivated. In this case, the fifth transistor TR5 may operate in the linear region. The fifth transistor TR5 may apply the high power supply voltage ELVDD to the first terminal of the first transistor TR1 while the light emission signal EM is activated, such that the first transistor TR1 generates the driving current ID. In addition, the fifth transistor TR5 does not apply the high power supply voltage ELVDD while the light emission signal EM is inactivated, such that the data signal DATA applied to the first terminal of the first transistor TR1 is applied to the gate terminal of the first transistor TR1.

The sixth transistor TR6 may include a gate terminal, a first terminal, and a second terminal. The light emission signal EM may be applied to the gate terminal of the sixth transistor TR6. The first terminal of the sixth transistor TR6 may be connected to the second terminal of the first transistor TR1. The second terminal of the sixth transistor TR6 may be connected to the first terminal of the OLED. According to exemplary embodiments of the present inventive concept, the first terminal of the sixth transistor TR6 is a source terminal, and the second terminal of the sixth transistor TR6 is a drain terminal. According to exemplary embodiments of the present inventive concept, the first terminal of the sixth transistor TR6 may be a drain terminal, and the second terminal of the sixth transistor TR6 may be a source terminal.

The sixth transistor TR6 may provide the driving current ID generated by the first transistor TR1 to the OLED while the light emission signal EM is activated. In this case, the sixth transistor TR6 may operate in the linear region. For example, the sixth transistor TR6 may provide the driving current ID generated by the first transistor TR1 to the OLED while the light emission signal EM is activated, such that the OLED emits light. In addition, the sixth transistor TR6 may electrically disconnect the first transistor TR1 from the OLED while the light emission signal EM is inactivated, such that the compensated data signal DATA applied to the second terminal of the first transistor TR1 is applied to the gate terminal of the first transistor TR1.

The seventh transistor TR7 may include a gate terminal, a first terminal, and a second terminal. A diode initialization signal GB may be applied to the gate terminal of the seventh transistor TR7. The initialization voltage VINT may be applied to the first terminal of the seventh transistor TR7. The second terminal of the seventh transistor TR7 may be connected to the first terminal of the OLED. According to exemplary embodiments of the present inventive concept, the first terminal of the seventh transistor TR7 is a source terminal, and the second terminal of the seventh transistor TR7 is a drain terminal. According to exemplary embodiments of the present inventive concept, the first terminal of the seventh transistor TR7 may be a drain terminal, and the second terminal of the seventh transistor TR7 may be a source terminal.

The seventh transistor TR7 may apply the initialization voltage VINT to the first terminal of the OLED while the diode initialization signal GB is activated. In this case, the seventh transistor TR7 may operate in the linear region. For example, the seventh transistor TR7 may initialize the first terminal of the OLED as the initialization voltage VINT while the diode initialization signal GB is activated.

Alternatively, the data initialization signal GI and the diode initialization signal GB are substantially the same signal. An initialization operation of the gate terminal of the first transistor TR1 might not affect an initialization operation of the first terminal of the OLED. For example, the initialization operation of the gate terminal of the first transistor TR1 and the initialization operation of the first terminal of the OLED may be independent to each other. Therefore, the data initialization signal GI is used as the diode initialization signal GB, thereby increasing the manufacturing efficiency.

The storage capacitor CST may include the first terminal and the second terminal, and may be connected between the high power supply voltage wiring and the gate terminal of the first transistor TR1. For example, the first terminal of the storage capacitor CST may be connected to the gate terminal of the first transistor TR1, and the second terminal of the storage capacitor CST may be connected to the high power supply voltage wiring. The storage capacitor CST may maintain a voltage level of the gate terminal of the first transistor TR1 while the gate signal GW is inactivated. The light emission signal EM may be activated while the gate signal GW is inactivated (e.g., a section where the gate signal GW is inactivated may include a section where the light emission signal EM is activated). The driving current ID generated by the first transistor TR1 may be provided to the OLED while the emission signal EM is activated. Therefore, the driving current ID generated by the first transistor TR1 may be provided to the OLED based on the voltage level maintained by the storage capacitor CST.

Figure 4:
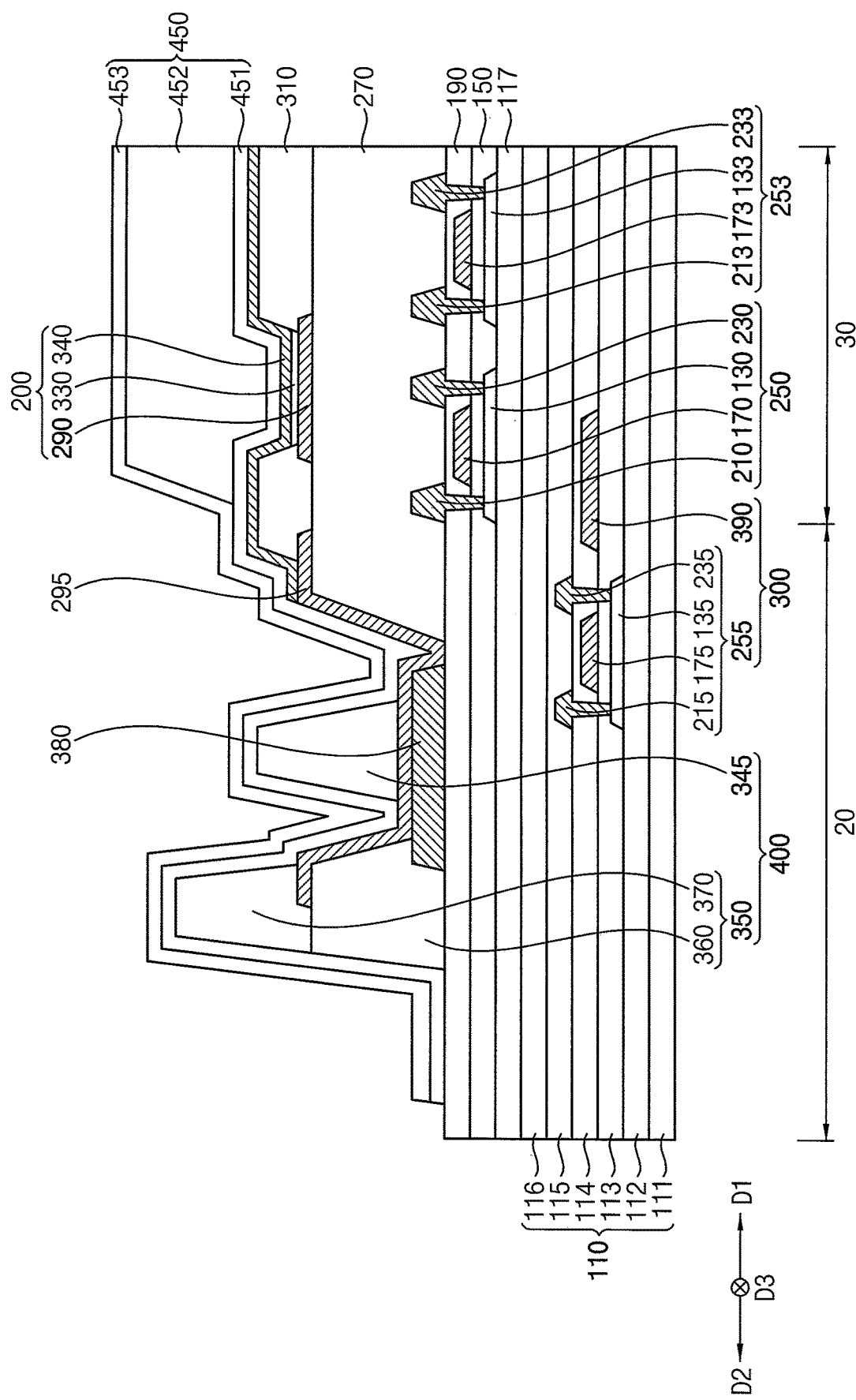
FIG. 4 is a cross-sectional view illustrating an example of the OLED display device of FIG. 1.
Figure 5:
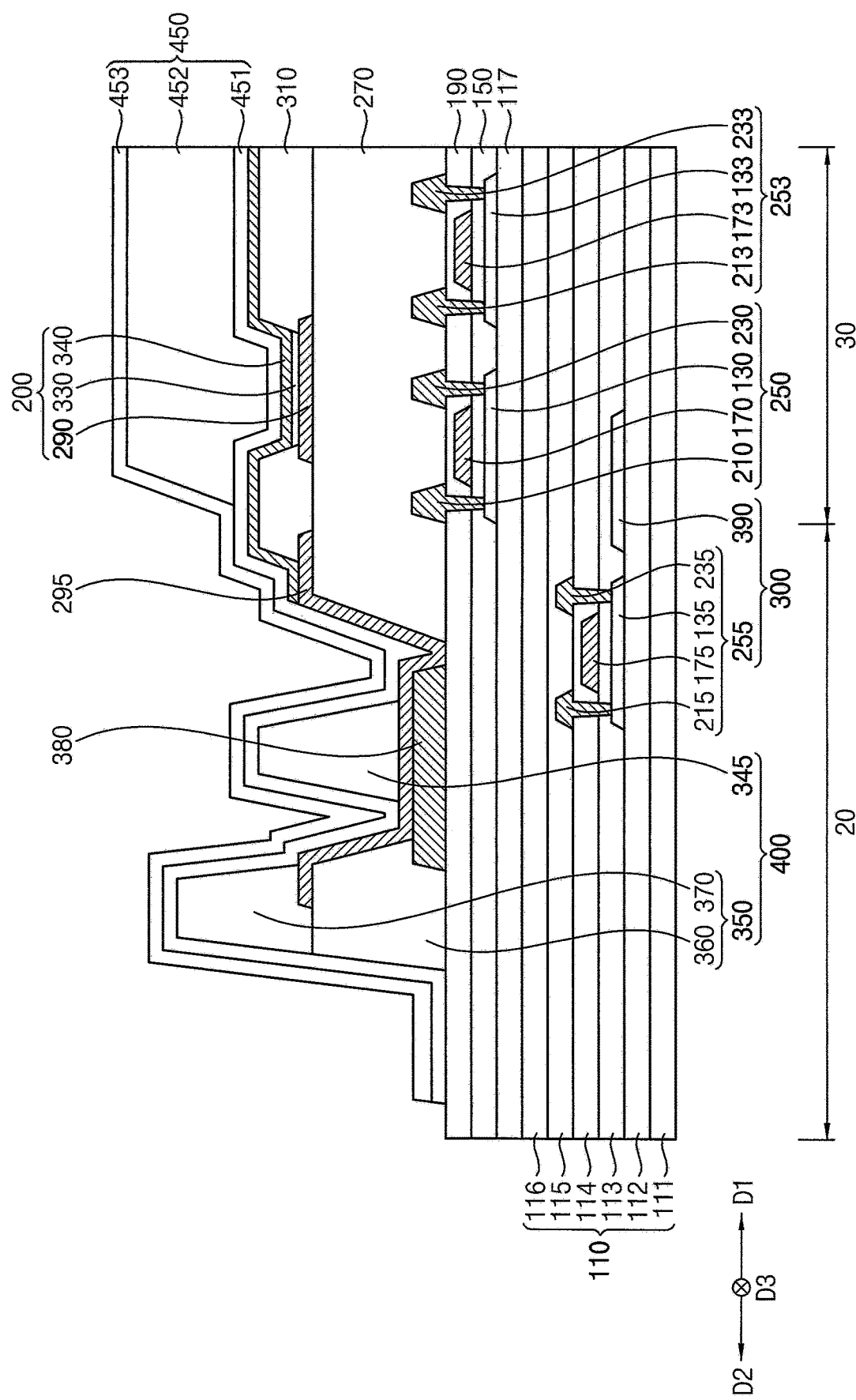
FIG. 5 is a cross-sectional view illustrating an example of the OLED display device of FIG. 1.

FIG. 3 is a cross-sectional view taken along a line I-I' of FIG. 1, and FIG. 4 is a cross-sectional view illustrating an example of the OLED display device of FIG. 1. FIG. 5 is a cross-sectional view illustrating an example of the OLED display device of FIG. 1.

Referring to FIG. 3, an OLED display device 100 may include a substrate 110, a circuit structure 300, a buffer layer 117, a gate insulation layer 150, an insulating interlayer 190, a switching transistor 250, a driving transistor 253, a power supply wiring 380, a planarization layer 270, a block structure 400, a sub-pixel structure 200, a connection pattern 295, a pixel defining layer 310, a thin film encapsulation ("TFE") structure 450, etc. Here, the substrate 110 may include a first organic layer 111, a first barrier layer 112, a second barrier layer 113, a third barrier layer 114, a second organic layer 115, and a fourth barrier layer 116. As the OLED display device 100 includes a sub-pixel region 30 and a peripheral region 20, and the substrate 110 may be divided as the sub-pixel region 30 and the peripheral region 20. The circuit structure 300 may include a gate driving unit 255 and an initialization voltage wiring 390, and the gate driving unit 255 may include an active pattern 135, a gate electrode pattern 175, a source electrode pattern 215, and a drain electrode pattern 235. In addition, the switching transistor 250 may include a first active layer 130, a first gate electrode 170, a first source electrode 210, and a first drain electrode 230. The driving transistor 253 may include a second active layer 133, a second gate electrode 173, a second source electrode 213, and a second drain electrode 233. The block structure 400 may include a first block pattern 345 and a second block pattern 350, and the second block pattern 350 may include a first sub-block pattern 360 and a second sub-block pattern 370. Further, the sub-pixel structure 200 may include a lower electrode 290, a light emitting layer 330, and an upper electrode 340, and the TFE structure 450 may include a first TFE layer 451, a second TFE layer 452, and a third TFE layer 453. According to exemplary embodiments of the present inventive concept, in the peripheral region 20 and a portion of the sub-pixel regions 30, the circuit structure 300 may be buried within the substrate 110.

As described above, the OLED display device 100 may include the display region 10 including a plurality of sub-pixel regions 30 and the peripheral region 20 at least partially surrounding the display region 10. For example, the sub-pixel region 30 of FIG. 3 may correspond to the sub-pixel region 30, which is located adjacent to the peripheral region 20, among a plurality of sub-pixel regions 30. For example, the sub-pixel region 30 of FIG. 3 may be located at an outmost portion of the display region 10.

An image may be displayed in the sub-pixel region 30 through the sub-pixel structure 200, and the block structure 400, the power supply wiring 380 (e.g., a low power supply wiring), the circuit structure 300, etc. may be disposed in the peripheral region 20. Here, the peripheral region 20 may be a non-display region. A plurality of transistors, a plurality of capacitors, a plurality of wirings (e.g., a gate signal wiring, a data signal wiring, a high power supply wiring, a light emission signal wiring, an initialization signal wiring, etc.), etc. may be additionally disposed in the display region 10. As the OLED display device 100 includes the flexible substrate 110 and the TFE structure 450, the OLED display device 100 may serve as a flexible OLED display device.

The first organic layer 111 may be provided. The first organic layer 111 may include flexible organic materials. As used herein, the term "flexible" is understood to mean capable of being bent, to some degree, without experiencing cracking or otherwise causing breakage. The degree to which such an element may be bent without cracking or breakage may be varied, but may be, for example, such that the radius of curvature is less than twice a total length of the layer. According to exemplary embodiments of the present inventive concept, the first organic layer 111 may include polyimide, etc.

The first barrier layer 112 may be disposed on the entire first organic layer 111. The first barrier layer 112 may block moisture or water that permeates through the first organic layer 111. The first barrier layer 112 may include flexible inorganic materials. According to exemplary embodiments of the present inventive concept, the first barrier layer 112 may include silicon oxide, silicon nitride, etc.

The active pattern 135 may be disposed in the peripheral region 20 on the first barrier layer 112. The active pattern 135 may include an oxide semiconductor, an inorganic semiconductor (e.g., amorphous silicon, polysilicon, etc.), an organic semiconductor, etc. Alternatively, the active pattern 135 may be disposed in a portion of the sub-pixel region 30 that is located adjacent to the peripheral region 20 on the first barrier layer 112.

The second barrier layer 113 may be disposed on the first barrier layer 112 and the active pattern 135. The second barrier layer 113 may at least partially cover the active pattern 135 in the peripheral region 20 on the first barrier layer 112, and may extend in a first direction D1 that is parallel to an upper surface of the substrate 110. For example, the second barrier layer 113 may be disposed on the entire first barrier layer 112. For example, the second barrier layer 113 may sufficiently cover the active pattern 135 on the first barrier layer 112, and may have a substantially flat upper surface without a step around the active pattern 135. Alternatively, the second barrier layer 113 may at least partially cover the active pattern 135 on the first barrier layer 112, and may be disposed as a substantially uniform thickness along a profile of the active pattern 135. The second barrier layer 113 may include flexible inorganic materials. According to exemplary embodiments of the present inventive concept, the second barrier layer 113 may include silicon oxide, silicon nitride, etc.

The gate electrode pattern 175 may be disposed in the peripheral region 20 on the second barrier layer 113. For example, the gate electrode pattern 175 may be disposed on the second barrier layer 113 under which the active pattern 135 is located. The gate electrode pattern 175 may include a metal, a metal alloy, metal nitride, conductive metal oxide, transparent conductive materials, etc. For example, the gate electrode pattern 175 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an alloy of aluminum, aluminum nitride (AlNx), an alloy of silver, tungsten nitride (WNx), an alloy of copper, an alloy of molybdenum, titanium nitride (TiNx), chromium nitride (CrNx), tantalum nitride (TaNx), strontium ruthenium oxide (SrRuxOy), zinc oxide (ZnOx), indium tin oxide (ITO), stannum oxide (SnOx), indium oxide (InOx), gallium oxide (GaOx), indium zinc oxide (IZO), etc. These may be used alone or in a suitable combination thereof. Alternatively, the gate electrode pattern 175 may have a multi-layered structure including a plurality of layers.

The third barrier layer 114 may be disposed on the second barrier layer 113 and the gate electrode pattern 175. The third barrier layer 114 may at least partially cover the gate electrode pattern 175 in the peripheral region 20 on the second barrier layer 113, and may extend first direction D1. For example, the third barrier layer 114 may be disposed on the entire second barrier layer 113. For example, the third barrier layer 114 may sufficiently cover the gate electrode pattern 175 on the second barrier layer 113, and may have a substantially flat upper surface without a step around the gate electrode pattern 175. Alternatively, the third barrier layer 114 may at least partially cover the gate electrode pattern 175 on the second barrier layer 113, and may be disposed as a substantially uniform thickness along a profile of the gate electrode pattern 175. The third barrier layer 114 may include flexible inorganic materials. According to exemplary embodiments of the present inventive concept, the third barrier layer 114 may include silicon oxide, silicon nitride, etc.

The source electrode pattern 215 and the drain electrode pattern 235 may be disposed in the peripheral region 20 on the third barrier layer 114. The source electrode pattern 215 may be in contact with a source region of the active pattern 135 via a contact hole formed by removing a first portion of the second barrier layer 113 and the third barrier layer 114. The drain electrode pattern 235 may be in contact with a drain region of the active pattern 135 via a contact hole formed by removing a second portion of the second barrier layer 113 and the third barrier layer 114. Each of the source electrode pattern 215 and the drain electrode pattern 235 may include a metal, a metal alloy, metal nitride, conductive metal oxide, transparent conductive materials, etc. These may be used alone or in a suitable combination thereof. Alternatively, each of the source electrode pattern 215 and the drain electrode pattern 235 may have a multi-layered structure including a plurality of layers. Accordingly, the gate driving unit 255 including the active pattern 135, the gate electrode pattern 175, the source electrode pattern 215, and the drain electrode pattern 235 may be constituted.

As described above, the gate driving unit 255 may generate a gate signal GW (refer to FIG. 2), and may provide the gate signal GW to the switching transistor 250 (e.g., the first gate electrode 170). For example, the gate driving unit 255 may be electrically connected to the switching transistor 250 in a different cross-sectional view of the OLED display device 100.

According to exemplary embodiments of the present inventive concept, the gate driving unit 255 includes one transistor, but the present invention is not limited thereto. For example, according to exemplary embodiments of the present inventive concept, the gate driving unit 255 may include at least two transistors and at least one capacitor.

In addition, the gate driving unit 255 has a top gate structure, but the present invention is not limited thereto. For example, the gate driving unit 255 may have a bottom gate structure and/or a double gate structure.

The initialization voltage wiring 390 may be disposed in a portion of the peripheral region 20 and a portion of the sub-pixel region 30 on the third barrier layer 114. The initialization voltage wiring 390 may be spaced apart from the source electrode pattern 215 and the drain electrode pattern 235 (or the gate driving unit 255). The initialization voltage wiring 390 may include a metal, a metal alloy, metal nitride, conductive metal oxide, transparent conductive materials, etc. These may be used alone or in a suitable combination thereof. Alternatively, the initialization voltage wiring 390 may have a multi-layered structure including a plurality of layers. According to exemplary embodiments of the present inventive concept, the source electrode pattern 215, the drain electrode pattern 235, and the initialization voltage wiring 390 may be simultaneously (or concurrently) formed using the same materials.

According to an exemplary embodiment of the present inventive concept, as illustrated in FIG. 4, the initialization voltage wiring 390 and the gate electrode pattern 175 may be located at a same layer, and may be simultaneously formed using the same materials.

According to an exemplary embodiment of the present inventive concept, as illustrated in FIG. 5, the initialization voltage wiring 390 and the active pattern 135 may be located at a same layer, and may be simultaneously formed using the same materials.

As described above, an initialization voltage VINT may be applied to the initialization voltage wiring 390, and may be provided to the driving transistor 253 (e.g., the second gate electrode 173) through the initialization voltage wiring 390 (refer to FIG. 2). For example, the initialization voltage wiring 390 may be electrically connected to the driving transistor 253 in a different cross-sectional view of the OLED display device 100.

Accordingly, the circuit structure 300 including the gate driving unit 255 and the initialization voltage wiring 390 may be constituted. According to exemplary embodiments of the present inventive concept, the substrate 110 may include a plurality of layers (e.g., the first organic layer 111, the first barrier layer 112, the second barrier layer 113, the third barrier layer 114, the second organic layer 115, and the fourth barrier layer 116), and the circuit structure 300 may be interposed between the plurality of layers. In addition, the circuit structure 300 and the switching and driving transistors 250 and 253 may be located at different layers.

For example, the circuit structure 300 and the switching and driving transistors 250 and 253 may be located at a same layer in a conventional OLED display device. For example, the circuit structure 300 and the switching and driving transistors 250 and 253 may be manufactured in a same process. In this case, since the circuit structure 300, the power supply wiring 380, the switching transistor 250, and the driving transistor 253 are spaced apart from each other in a same layer, a dead space (e.g., the peripheral region 20) of the conventional OLED display device may be increased.

As the circuit structure 300, according to exemplary embodiments of the present inventive concept, is buried in (or embedded in) an interior of the substrate 110, a portion of the circuit structure 300 may be disposed to overlap the sub-pixel structure 200 (or the switching transistor 250, the driving transistor 253, etc.). In this case, compared to the conventional OLED display device, a dead space of the OLED display device 100 may be reduced. Accordingly, the OLED display device 100 may have a smaller width of a bezel corresponding to a non-display region, and/or may increase an area of the display region 10.

The second organic layer 115 may be disposed on the third barrier layer 114, the source electrode pattern 215, the drain electrode pattern 235, and the initialization voltage wiring 390. The second organic layer 115 may at least partially cover the source electrode pattern 215, the drain electrode pattern 235, and the initialization voltage wiring 390 on the third barrier layer 114, and may extend in the first direction D1. For example, the second organic layer 115 may be disposed on the entire third barrier layer 114. For example, the second organic layer 115 may sufficiently cover the source electrode pattern 215, the drain electrode pattern 235, and the initialization voltage wiring 390 on the third barrier layer 114, and may have a substantially flat upper surface without a step around the source electrode pattern 215, the drain electrode pattern 235, and the initialization voltage wiring 390. Alternatively, the second organic layer 115 may at least partially cover the source electrode pattern 215, the drain electrode pattern 235, and the initialization voltage wiring 390 on the third barrier layer 114, and may be disposed as a substantially uniform thickness along a profile of the source electrode pattern 215, the drain electrode pattern 235, and the initialization voltage wiring 390. The second organic layer 115 may include flexible organic materials. According to exemplary embodiments of the present inventive concept, the second organic layer 115 may include polyimide, etc. Alternatively, a barrier layer including flexible inorganic materials may be disposed instead of the second organic layer 115.

The fourth barrier layer 116 may be disposed on the entire second organic layer 115. The fourth barrier layer 116 may block moisture or water that permeates through the second organic layer 115. The fourth barrier layer 116 may include flexible inorganic materials. According to exemplary embodiments of the present inventive concept, the fourth barrier layer 116 may include silicon oxide, silicon nitride, etc. Alternatively, an organic layer including flexible organic materials may be disposed instead of the fourth barrier layer 116.

Accordingly, the substrate 110 including the first organic layer 111, the first barrier layer 112, the second barrier layer 113, the third barrier layer 114, the second organic layer 115, and the fourth barrier layer 116 may be constituted.

According to exemplary embodiments of the present inventive concept, the substrate 110 includes six layers, but the present invention is not limited thereto. For example, according to exemplary embodiments of the present inventive concept, the substrate 110 may include a single layer or at least four layers.

The buffer layer 117 may be disposed on the substrate 110. The buffer layer 117 may be disposed on the entire substrate 110. The buffer layer 117 may prevent the diffusion of metal atoms and/or impurities from the substrate 110 into the switching transistor 250 and the driving transistor 253. Additionally, the buffer layer 117 may control a rate of a heat transfer in a crystallization process for forming the first active layer 130 and the second active layer 133, thereby obtaining substantially uniform first and second active layers 130 and 133. Furthermore, the buffer layer 117 may increase the surface flatness of the substrate 110 when a surface of the substrate 110 is relatively uneven. According to a type of the substrate 110, at least two buffer layers 117 may be provided on the substrate 110, or the buffer layer 117 might not be formed. For example, the buffer layer 117 may include organic materials or inorganic materials. According to exemplary embodiments of the present inventive concept, the buffer layer 117 may include inorganic materials.

The first active layer 130 may be disposed in the sub-pixel region 30 on the substrate 110. The first active layer 130 may include an oxide semiconductor, an inorganic semiconductor, an organic semiconductor, etc.

The second active layer 133 may be spaced apart from the first active layer 130 in the first direction D1 on the buffer layer 117. The second active layer 133 may include an oxide semiconductor, an inorganic semiconductor, an organic semiconductor, etc. According to exemplary embodiments of the present inventive concept, the first active layer 130 and the second active layer 133 may be simultaneously formed using the same materials.

The gate insulation layer 150 may be disposed on the buffer layer 117, the first active layer 130, and the second active layer 133. The gate insulation layer 150 may at least partially cover the first and second active layers 130 and 133 in the sub-pixel region 30 on the buffer layer 117, and may extend in the first direction D1. For example, the gate insulation layer 150 may be disposed on the entire buffer layer 117. For example, the gate insulation layer 150 may sufficiently cover the first and second active layers 130 and 133 on the buffer layer 117, and may have a substantially flat upper surface without a step around the first and second active layers 130 and 133. Alternatively, the gate insulation layer 150 may at least partially cover the first and second active layers 130 and 133 on the buffer layer 117, and may be disposed as a substantially uniform thickness along a profile of the first and second active layers 130 and 133. The gate insulation layer 150 may include inorganic materials such as silicon compound, metal oxide, etc. For example, the gate insulation layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The first gate electrode 170 may be disposed in the sub-pixel region 30 on the gate insulation layer 150. For example, the first gate electrode 170 may be disposed on the gate insulation layer 150 under which the first active layer 130 is located. The first gate electrode 170 may include a metal, an alloy of a metal, metal nitride, conductive metal oxide, transparent conductive materials, etc. These may be used alone or in a suitable combination thereof. Alternatively, the first gate electrode 170 may have a multi-layered structure including a plurality of layers.

The second gate electrode 173 may be spaced apart from the first gate electrode 170 in the first direction D1 on the gate insulation layer 150. For example, the second gate electrode 173 may be disposed on the gate insulation layer 150 under which the second active layer 133 is located. The second gate electrode 173 may include a metal, an alloy of a metal, metal nitride, conductive metal oxide, transparent conductive materials, etc. These may be used alone or in a suitable combination thereof. Alternatively, the second gate electrode 173 may have a multi-layered structure including a plurality of layers. According to exemplary embodiments of the present inventive concept, the first gate electrode 170 and the second gate electrode 173 may be simultaneously formed using the same materials.

The insulating interlayer 190 may be disposed on the gate insulation layer 150 and the first and second gate electrodes 170 and 173. The insulating interlayer 190 may at least partially cover the first and second gate electrodes 170 and 173 in the sub-pixel region 30 on the gate insulation layer 150, and may extend in the first direction D1. For example, the insulating interlayer 190 may be disposed on the entire gate insulation layer 150. For example, the insulating interlayer 190 may sufficiently cover the first and second gate electrodes 170 and 173 on the gate insulation layer 150, and may have a substantially flat upper surface without a step around the first and second gate electrodes 170 and 173. Alternatively, the insulating interlayer 190 may at least partially cover the first and second gate electrodes 170 and 173 on the gate insulation layer 150, and may be disposed as a substantially uniform thickness along a profile of the first and second gate electrodes 170 and 173. The insulating interlayer 190 may include silicon compound, metal oxide, etc.

The first source electrode 210 and the first drain electrode 230 may be disposed in the sub-pixel region 30 on the insulating interlayer 190. The first source electrode 210 may be in contact with a source region of the first active layer 130 via a contact hole formed by removing a first portion of the gate insulation layer 150 and the insulating interlayer 190, and the first drain electrode 230 may be in contact with a drain region of the first active layer 130 via a contact hole formed by removing a second portion of the gate insulation layer 150 and the insulating interlayer 190.

The second source electrode 213 and the second drain electrode 233 may be spaced apart from the first source and first drain electrodes 210 and 230 in the first direction D1 on the insulating interlayer 190. The second source electrode 213 may be in contact with a source region of the second active layer 133 via a contact hole formed by removing a third portion of the gate insulation layer 150 and the insulating interlayer 190, and the second drain electrode 233 may be in contact with a drain region of the second active layer 133 via a contact hole formed by removing a fourth portion of the gate insulation layer 150 and the insulating interlayer 190.

Each of the first source and first drain electrodes 210 and 230 and the second source and second drain electrodes 213 and 233 may include a metal, an alloy of a metal, metal nitride, conductive metal oxide, transparent conductive materials, etc. These may be used alone or in a suitable combination thereof. Alternatively, each of the first source and first drain electrodes 210 and 230 and the second source and second drain electrodes 213 and 233 may have a multi-layered structure including a plurality of layers. According to exemplary embodiments of the present inventive concept, the first source and first drain electrodes 210 and 230 and the second source and second drain electrodes 213 and 233 may be simultaneously formed using the same materials.

Accordingly, the switching transistor 250 including the first active layer 130, the first gate electrode 170, the first source electrode 210, and the first drain electrode 230 may be constituted, and the driving transistor 253 including the second active layer 133, the second gate electrode 173, the second source electrode 213, and the second drain electrode 233 may be constituted. The switching transistor 250 may be spaced apart from the driving transistor 253. As described above, the switching transistor 250 may correspond to a third transistor TR3 of FIG. 2, and the driving transistor 253 may correspond to a first transistor TR1 of FIG. 2. For example, a second transistor TR2, fourth through seventh transistors TR4, TR5, TR6 and TR7, and a storage capacitor CST, etc. may be disposed in a different cross-sectional view of the OLED display device 100.

According to exemplary embodiments of the present inventive concept, each of the switching transistor 250 and the driving transistor 253 has top gate structure, but the present invention is not limited thereto. For example, according to exemplary embodiments of the present inventive concept, each of the switching transistor 250 and the driving transistor 253 may have a bottom gate structure and/or a double gate structure.

The power supply wiring 380 may be disposed in the peripheral region 20 on the insulating interlayer 190. According to exemplary embodiments of the present inventive concept, the power supply wiring 380 may be spaced apart from the first source and first drain electrodes 210 and 230 and the second source and second drain electrodes 213 and 233. As described above, a low power supply voltage ELVSS may be provided to the power supply wiring 380 (refer to FIG. 2). Here, the low power supply voltage ELVSS may be applied to the upper electrode 340. For example, the power supply wiring 380 may include a metal, an alloy of a metal, metal nitride, conductive metal oxide, transparent conductive materials, etc. These may be used alone or in a suitable combination thereof. Alternatively, the power supply wiring 380 may have a multi-layered structure including a plurality of layers. According to exemplary embodiments of the present inventive concept, the power supply wiring 380, the first source and first drain electrodes 210 and 230, and the second source and second drain electrodes 213 and 233 may be simultaneously formed using the same materials.

According to exemplary embodiments of the present inventive concept, the OLED display device 100 may further include a plurality of wirings in the peripheral region 20 or the sub-pixel region 30. For example, the plurality of wirings may be disposed between the power supply wiring 380 and the first source electrode 210.

The planarization layer 270 may be disposed on the insulating interlayer 190, the power supply wiring 380, the first source and first drain electrodes 210 and 230, and the second source and second drain electrodes 213 and 233, and might not overlap the power supply wiring 380. The planarization layer 270 may be disposed as a high thickness to sufficiently cover the power supply wiring 380, the first source and first drain electrodes 210 and 230, and the second source and second drain electrodes 213 and 233 on the insulating interlayer 190. In this case, the planarization layer 270 may have a substantially flat upper surface, and a planarization process may be further performed on the planarization layer 270 to implement the flat upper surface of the planarization layer 270. The planarization layer 270 may include organic materials or inorganic materials. According to exemplary embodiments of the present inventive concept, the planarization layer 270 may include organic materials. For example, the planarization layer 270 may include photoresist, polyacryl-based resin, polyimide-based resin, a polyamide-based resin, a siloxane-based resin, acryl-based resin, epoxy-based resin, etc.

The first sub-block pattern 360 may be disposed in the peripheral region 20 on the insulating interlayer 190. The first sub-block pattern 360 may overlap a portion of the power supply wiring 380. In addition, the first sub-block pattern 360 may block a leakage of the second TFE layer 452, and may be located at a same layer with the planarization layer 270. The first sub-block pattern 360 may include organic materials or inorganic materials. According to exemplary embodiments of the present inventive concept, the first sub-block pattern 360 may include organic materials.

The lower electrode 290 may be disposed in the sub-pixel region 30 on the planarization layer 270. For example, the lower electrode 290 may include a metal, an alloy of a metal, metal nitride, conductive metal oxide, transparent conductive materials, etc. These may be used alone or in a suitable combination thereof. Alternatively, the lower electrode 290 may have a multi-layered structure including a plurality of layers.

The connection pattern 295 may be disposed in the peripheral region 20 on a portion of the planarization layer 270, the power supply wiring 380, and a portion of an upper surface of the first sub-block pattern 360. For example, the connection pattern 295 may be spaced apart from the lower electrode 290 on the planarization layer 270, and may extend in a second direction D2 that is opposite to the first direction D1. In addition, the connection pattern 295 may be disposed along a profile of the planarization layer 270, the power supply wiring 380, and the first sub-block pattern 360. The connection pattern 295 may be interposed between the first block pattern 345 and the power supply wiring 380 in the peripheral region 20, and a portion of the connection pattern 295 may be interposed between the first sub-block pattern 360 and the second sub-block pattern 370. Alternatively, the connection pattern 295 might not be disposed on the upper surface of the first sub-block pattern 360. The connection pattern 295 may electrically connect the power supply wiring 380 and the upper electrode 340, and may receive the low power supply voltage ELVSS from the power supply wiring 380. The low power supply voltage ELVSS may be applied to the upper electrode 340 through the connection pattern 295. The connection pattern 295 may include a metal, an alloy of a metal, metal nitride, conductive metal oxide, transparent conductive materials, etc. These may be used alone or in a suitable combination thereof. Alternatively, the connection pattern 295 may have a multi-layered structure including a plurality of layers. According to exemplary embodiments of the present inventive concept, the lower electrode 290 and the connection pattern 295 may be simultaneously formed using the same materials.

The pixel defining layer 310 may be disposed on a portion of the lower electrode 290, a portion of the connection pattern 295, and the planarization layer 270. The pixel defining layer 310 may at least partially cover both lateral portions of the lower electrode 290, and may have an opening that exposes a portion of an upper surface of the lower electrode 290. The pixel defining layer 310 may include organic materials or inorganic materials. According to exemplary embodiments of the present inventive concept, the pixel defining layer 310 may include organic materials.

The light emitting layer 330 may be disposed on the lower electrode 290 exposed by the opening of the pixel defining layer 310. The light emitting layer 330 may be formed using at least one of light emitting materials capable of generating different colors of light (e.g., red, blue, and green, etc.) according to sub-pixels. Alternatively, the light emitting layer 330 may generally generate white light by stacking a plurality of light emitting materials capable of generating different colors of light such as red, green, blue, etc. In this case, a color filter may be disposed on the light emitting layer 330 (e.g., to overlap the light emitting layer 330 on an upper surface of the TFE structure 450). The color filter may include a red color filter, a green color filter, and/or a blue color filter. Alternatively, the color filter may include a yellow color filter, a cyan color filter, and a magenta color filter. The color filter may include a photosensitive resin, a color photoresist, etc.

The first block pattern 345 may be disposed in the peripheral region 20 on the connection pattern 295. For example, the first block pattern 345 may be disposed on the connection pattern 295 under which the power supply wiring 380 is located. As illustrated in FIG. 1, the first block pattern 345 may at least partially surround the display region 10 (or the sub-pixel region 30). According to exemplary embodiments of the present inventive concept, the first block pattern 345 may block a leakage of the second TFE layer 452. The first block pattern 345 may include organic materials or inorganic materials. According to exemplary embodiments of the present inventive concept, the first block pattern 345 may include organic materials.

The second sub-block pattern 370 may be disposed on the first sub-block pattern 360 and a portion of the connection pattern 295. According to exemplary embodiments of the present inventive concept, the second sub-block pattern 370, together with the first sub-block pattern 360, may block a leakage of the second TFE layer 452. In addition, the second sub-block pattern 370 may include organic materials. According to exemplary embodiments of the present inventive concept, the pixel defining layer 310, the first block pattern 345, and the second sub-block pattern 370 may be simultaneously formed using the same materials.

Accordingly, the second block pattern 350 including the first sub-block pattern 360 and the second sub-block pattern 370 may be constituted. As illustrated in FIG. 1, the second block pattern 350 may be spaced apart from the first block pattern 345, and may at least partially surround the first block pattern 345. A height of the second block pattern 350 may be greater than a height of the first block pattern 345. In addition, the first block pattern 345 and the second block pattern 350 may be defined as the block structure 400.

The upper electrode 340 may be disposed on the pixel defining layer 310 and the light emitting layer 330. The upper electrode 340 may at least partially cover the light emitting layer 330 and the pixel defining layer 310, and may be disposed on the entire substrate 110. According to exemplary embodiments of the present inventive concept, the upper electrode 340 may at least partially cover the light emitting layer 330 and extend in the first direction D1, and may be electrically connected to the connection pattern 295. The upper electrode 340 may include a metal, a metal alloy, metal nitride, conductive metal oxide, transparent conductive materials, etc. These may be used alone or in a suitable combination thereof. Alternatively, the upper electrode 340 may have a multi-layered structure including a plurality of layers. Accordingly, the sub-pixel structure 200 including the lower electrode 290, the light emitting layer 330, and the upper electrode 340 may be constituted.

The first TFE layer 451 may be disposed on the upper electrode 340, the connection pattern 295, the block structure 400, and the insulating interlayer 190. The first TFE layer 451 may at least partially cover the upper electrode 340, the connection pattern 295, and the block structure 400, and may be disposed as a substantially uniform thickness along a profile of the upper electrode 340, the connection pattern 295, and the block structure 400. The first TFE layer 451 may prevent the sub-pixel structure 200 from being deteriorated by the permeation of moisture, water, oxygen, etc. In addition, the first TFE layer 451 may protect the sub-pixel structure 200 from external impacts. The first TFE layer 451 may include flexible inorganic materials.

The second TFE layer 452 may be disposed on the first TFE layer 451. The second TFE layer 452 may increase the flatness of the OLED display device 100, and may protect the sub-pixel structure 200. The second TFE layer 452 may include flexible organic materials.

The third TFE layer 453 may be disposed on the second TFE layer 452. The third TFE layer 453 may at least partially cover the second TFE layer 452, and may be disposed as a substantially uniform thickness along a profile of the second TFE layer 452. The third TFE layer 453, together with the first TFE layer 451 and the second TFE layer 452, may prevent the sub-pixel structure 200 from being deteriorated by the permeation of moisture, water, oxygen, etc. In addition, the third TFE layer 453, together with the first TFE layer 451 and the second TFE layer 452, may protect the sub-pixel structure 200 from external impacts. The third TFE layer 453 may include flexible inorganic materials. Accordingly, the TFE structure 450 including the first TFE layer 451, the second TFE layer 452, and the third TFE layer 453 may be constituted.

Alternatively, the TFE structure 450 may have five layers structure where first through fifth TFE layers are stacked or seven layers structure where the first through seventh TFE layers are stacked.

As the OLED display device 100, in accordance with exemplary embodiments of the present inventive concept, includes the circuit structure 300 that is buried in an interior of the substrate 110, the OLED display device 100 may reduce a width of a bezel corresponding to a non-display region and increase an area of the display region 10.

Alternatively, gate signal wirings, data signal wirings, high power supply wirings, light emission wirings, initialization signal wirings, etc. capable of being disposed in the OLED display device 100 may be additionally buried in an interior of the substrate 110.

FIGS. 6 through 12 are cross-sectional views illustrating a method of manufacturing an OLED display device in accordance with exemplary embodiments of the present inventive concept.

Figure 6:
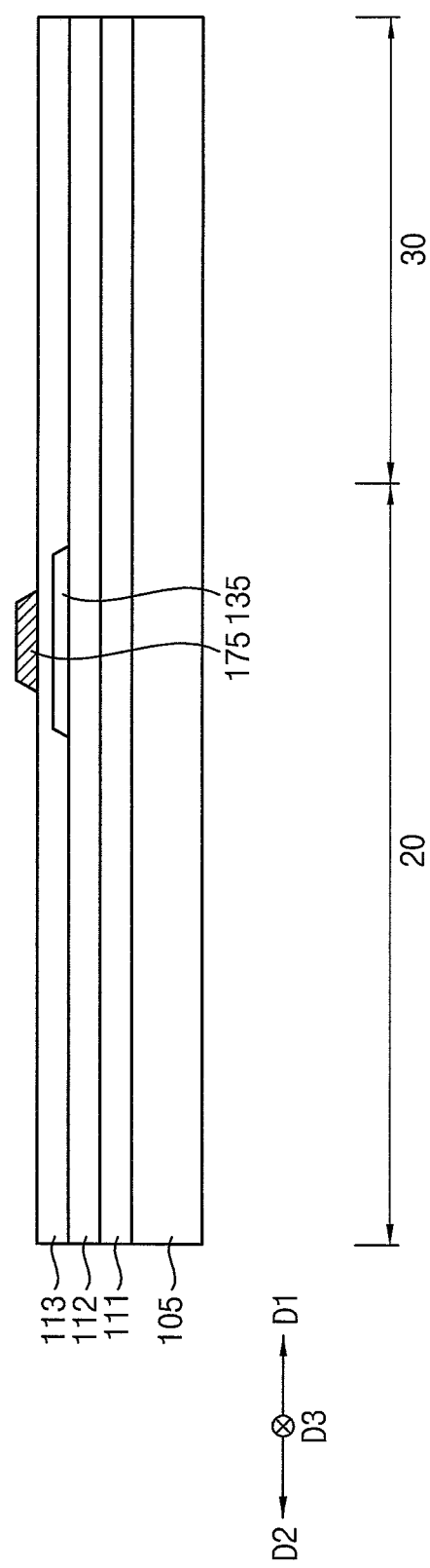
FIGS. 6 through 12 are cross-sectional views illustrating a method of manufacturing an OLED display device in accordance with exemplary embodiments of the present inventive concept.

Referring to FIG. 6, a rigid glass substrate 105 may be provided. A first organic layer 111 may be formed on the rigid glass substrate 105. The first organic layer 111 may be formed on the entire rigid glass substrate 105, and may be formed using flexible organic materials such as polyimide.

A first barrier layer 112 may be formed on the entire first organic layer 111. The first barrier layer 112 may block moisture or water that permeates through the first organic layer 111. The first barrier layer 112 may be formed using flexible inorganic materials such as silicon oxide, silicon nitride, etc.

In a method of manufacturing an OLED display device, since the first organic layer 111 and the first barrier layer 112 are relatively thin and flexible, the first organic layer 111 and the first barrier layer 112 may be formed on a rigid glass substrate 105 to help support a formation of the circuit structure 300.

An active pattern 135 may be formed in the peripheral region 20 on the first barrier layer 112. The active pattern 135 may be formed using an oxide semiconductor, an inorganic semiconductor, an organic semiconductor, etc.

A second barrier layer 113 may be formed on the first barrier layer 112 and the active pattern 135. The second barrier layer 113 may at least partially cover the active pattern 135 in the peripheral region 20 on the first barrier layer 112, and may extend in a first direction D1 that is parallel to an upper surface of the second barrier layer 113. For example, the second barrier layer 113 may be formed on the entire first barrier layer 112. For example, the second barrier layer 113 may sufficiently cover the active pattern 135 on the first barrier layer 112, and may have a substantially flat upper surface without a step around the active pattern 135. Alternatively, the second barrier layer 113 may at least partially cover the active pattern 135 on the first barrier layer 112, and may be formed as a substantially uniform thickness along a profile of the active pattern 135. The second barrier layer 113 may be formed of flexible inorganic materials such as silicon oxide, silicon nitride, etc.

A gate electrode pattern 175 may be formed in the peripheral region 20 on the second barrier layer 113. For example, the gate electrode pattern 175 may be formed on the second barrier layer 113 under which the active pattern 135 is located. The gate electrode pattern 175 may be formed using a metal, a metal alloy, metal nitride, conductive metal oxide, transparent conductive materials, etc. For example, the gate electrode pattern 175 may include Au, Ag, Al, W, Cu, Pt, Ni, Ti, Pd, Mg, Ca, Li, Cr, Ta, Mo, Sc, Nd, Ir, an alloy of aluminum, AlNx, an alloy of silver, WNx, an alloy of copper, an alloy of molybdenum, TiNx, CrNx, TaNx, SrRuxOy, ZnOx, ITO, SnOx, InOx, GaOx, IZO, etc. These may be used alone or in a suitable combination thereof. Alternatively, the gate electrode pattern 175 may have a multi-layered structure including a plurality of layers.

Figure 7:
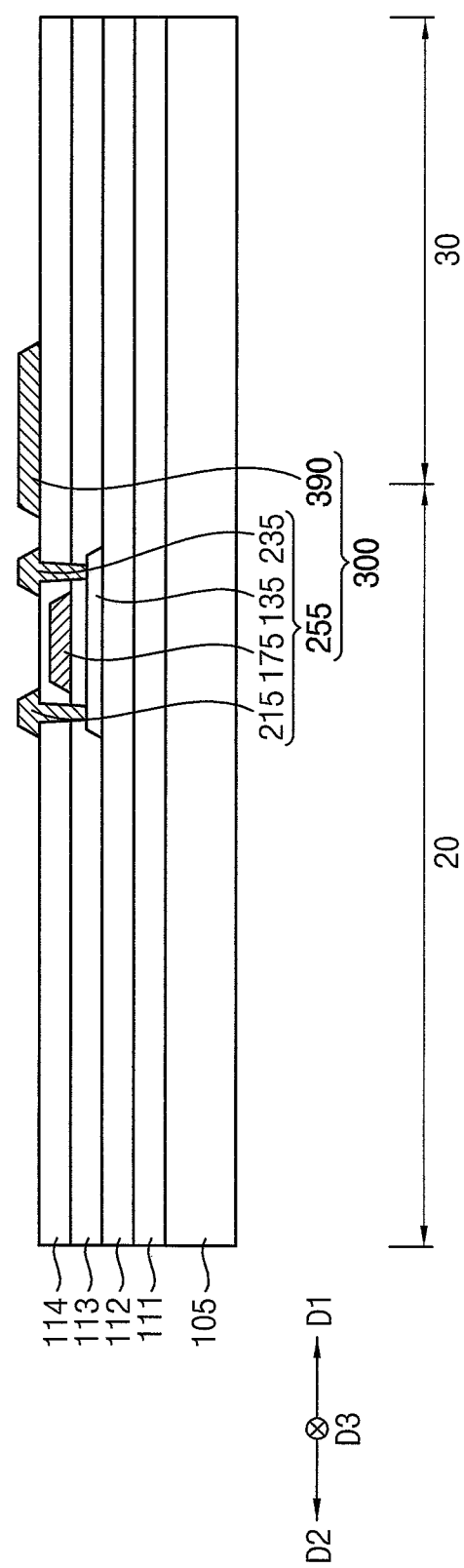

Referring to FIG. 7, a third barrier layer 114 may be formed on the second barrier layer 113 and the gate electrode pattern 175. The third barrier layer 114 may at least partially cover the gate electrode pattern 175 in the peripheral region 20 on the second barrier layer 113, and may extend first direction D1. For example, the third barrier layer 114 may be formed on the entire second barrier layer 113. For example, the third barrier layer 114 may sufficiently cover the gate electrode pattern 175 on the second barrier layer 113, and may have a substantially flat upper surface without a step around the gate electrode pattern 175. Alternatively, the third barrier layer 114 may at least partially cover the gate electrode pattern 175 on the second barrier layer 113, and may be formed as a substantially uniform thickness along a profile of the gate electrode pattern 175. The third barrier layer 114 may be formed using flexible inorganic materials such as silicon oxide, silicon nitride, etc.

A source electrode pattern 215 and a drain electrode pattern 235 may be formed in the peripheral region 20 on the third barrier layer 114. The source electrode pattern 215 may be in contact with a source region of the active pattern 135 via a contact hole formed by removing a first portion of the second barrier layer 113 and the third barrier layer 114. The drain electrode pattern 235 may be in contact with a drain region of the active pattern 135 via a contact hole formed by removing a second portion of the second barrier layer 113 and the third barrier layer 114. Each of the source electrode pattern 215 and the drain electrode pattern 235 may be formed using a metal, a metal alloy, metal nitride, conductive metal oxide, transparent conductive materials, etc. These may be used alone or in a suitable combination thereof. Alternatively, each of the source electrode pattern 215 and the drain electrode pattern 235 may have a multi-layered structure including a plurality of layers. Accordingly, a gate driving unit 255 including the active pattern 135, the gate electrode pattern 175, the source electrode pattern 215, and the drain electrode pattern 235 may be formed.

An initialization voltage wiring 390 may be formed in a portion of the peripheral region 20 and a portion of the sub-pixel region 30 on the third barrier layer 114. The initialization voltage wiring 390 may be spaced apart from the source electrode pattern 215 and the drain electrode pattern 235 (or the gate driving unit 255). The initialization voltage wiring 390 may be formed using a metal, a metal alloy, metal nitride, conductive metal oxide, transparent conductive materials, etc. These may be used alone or in a suitable combination thereof. Alternatively, the initialization voltage wiring 390 may have a multi-layered structure including a plurality of layers. According to exemplary embodiments of the present inventive concept, the source electrode pattern 215, the drain electrode pattern 235, and the initialization voltage wiring 390 may be simultaneously formed using the same materials. For example, after a first preliminary electrode layer is formed the entire third barrier layer 114, the source electrode pattern 215, the drain electrode pattern 235, and the initialization voltage wiring 390 may be formed by partially etching the first preliminary electrode layer. Accordingly, a circuit structure 300 including the gate driving unit 255 and the initialization voltage wiring 390 may be formed.

Figure 8:
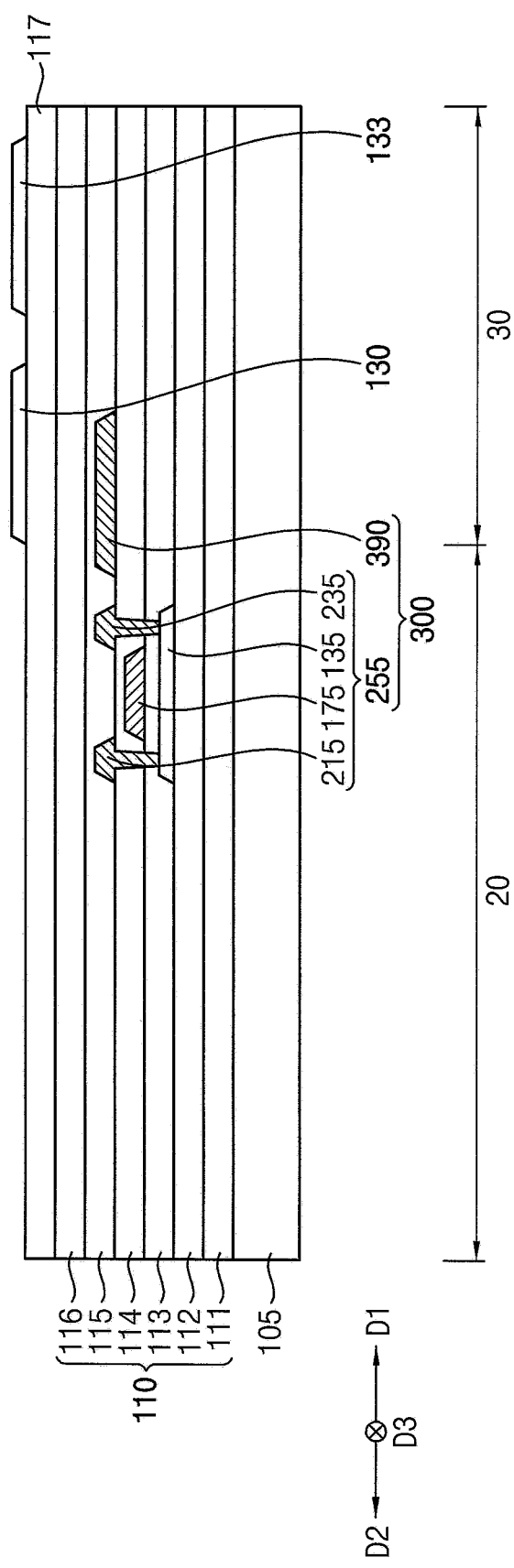

Referring to FIG. 8, a second organic layer 115 may be formed on the third barrier layer 114, the source electrode pattern 215, the drain electrode pattern 235, and the initialization voltage wiring 390. The second organic layer 115 may at least partially cover the source and drain electrode patterns 215 and 235, and the initialization voltage wiring 390 on the third barrier layer 114, and may extend in the first direction D1. For example, the second organic layer 115 may be formed on the entire third barrier layer 114. For example, the second organic layer 115 may sufficiently cover the source and drain electrode patterns 215 and 235 and the initialization voltage wiring 390 on the third barrier layer 114, and may have a substantially flat upper surface without a step around the source and drain electrode patterns 215 and 235 and the initialization voltage wiring 390. Alternatively, the second organic layer 115 may at least partially cover the source and drain electrode patterns 215 and 235 and the initialization voltage wiring 390 on the third barrier layer 114, and may be formed as a substantially uniform thickness along a profile of the source and drain electrode patterns 215 and 235 and the initialization voltage wiring 390. The second organic layer 115 may be formed using flexible organic materials such as polyimide, etc. Alternatively, a barrier layer including flexible inorganic materials instead of the second organic layer 115 may be formed.

A fourth barrier layer 116 may be formed on the entire second organic layer 115. The fourth barrier layer 116 may block moisture or water that permeates through the second organic layer 115. The fourth barrier layer 116 may be formed using flexible inorganic materials such as silicon oxide, silicon nitride, etc. Alternatively, an organic layer including flexible organic materials instead of the fourth barrier layer 116 may be formed. Accordingly, a substrate 110 including the first organic layer 111, the first barrier layer 112, the second barrier layer 113, the third barrier layer 114, the second organic layer 115, and the fourth barrier layer 116 may be formed.

The substrate 110 may be formed on the rigid glass substrate 105 to help support a formation of a switching transistor and a driving transistor, and a sub-pixel structure. For example, after the switching transistor, the driving transistor, and the sub-pixel structure are formed on the substrate 110, the rigid glass substrate 105 on which the substrate 110 is formed may be removed. For example, it may be difficult to directly form the switching transistor, the driving transistor, and the sub-pixel structure on the first organic layer 111, the first barrier layer 112, the second barrier layer 113, the third barrier layer 114, the second organic layer 115, and the fourth barrier layer 116 because the first organic layer 111, the first barrier layer 112, the second barrier layer 113, the third barrier layer 114, the second organic layer 115, and the fourth barrier layer 116 are relatively thin and flexible. Accordingly, the switching transistor, the driving transistor, and the sub-pixel structure are formed on the substrate 110 and the rigid glass substrate 105, and then the first organic layer 111, the first barrier layer 112, the second barrier layer 113, the third barrier layer 114, the second organic layer 115, and the fourth barrier layer 116 may serve as the substrate 110 after the removal of the rigid glass substrate 105.

According to exemplary embodiments of the present inventive concept, the substrate 110 includes six layers, but the present invention is not limited thereto. For example, according to exemplary embodiments of the present inventive concept, the substrate 110 may include a single layer or at least four layers.

A buffer layer 117 may be formed on the substrate 110. The buffer layer 117 may be formed on the entire substrate 110. The buffer layer 117 may prevent the diffusion of metal atoms and/or impurities from the substrate 110 into the switching transistor and the driving transistor. Additionally, the buffer layer 117 may control a rate of a heat transfer in a crystallization process for forming a first active layer and a second active layer, thereby obtaining substantially uniform first and second active layers. Furthermore, the buffer layer 117 may increase a surface flatness of the substrate 110 when a surface of the substrate 110 is relatively uneven. According to a type of the substrate 110, at least two buffer layers 117 may be provided on the substrate 110, or the buffer layer 117 might not be formed. For example, the buffer layer 117 may be formed using inorganic materials.

A first active layer 130 may be formed in the sub-pixel region 30 on the substrate 110. The first active layer 130 may be formed using an oxide semiconductor, an inorganic semiconductor, an organic semiconductor, etc.

A second active layer 133 may be spaced apart from the first active layer 130 in the first direction D1 on the buffer layer 117. The second active layer 133 and the first active layer 130 may be simultaneously formed using the same materials. For example, after a preliminary active layer is on the entire buffer layer 117, the first active layer 130 and the second active layer 133 may be formed by partially etching the preliminary active layer.

Figure 9:
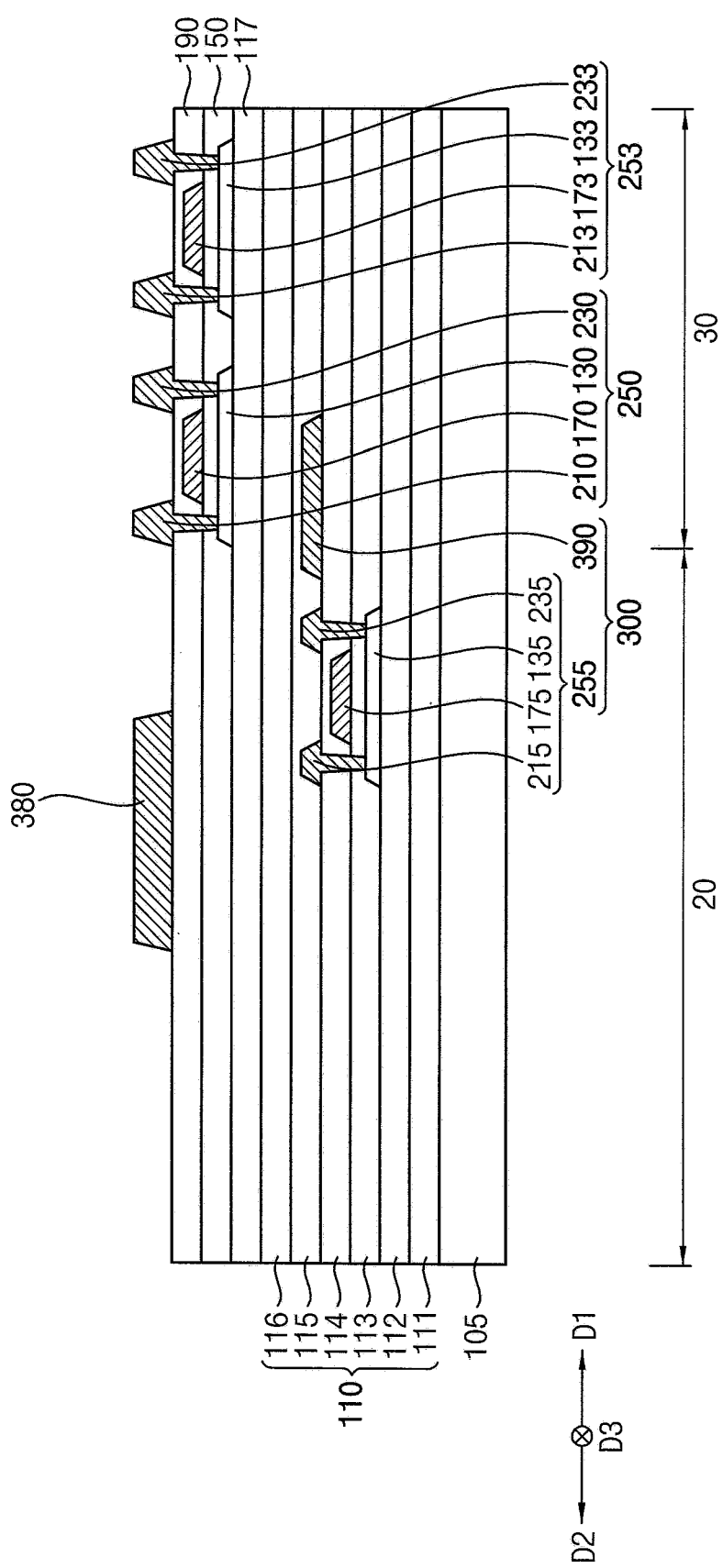

Referring to FIG. 9, a gate insulation layer 150 may be formed on the buffer layer 117, the first active layer 130, and the second active layer 133. The gate insulation layer 150 may at least partially cover the first and second active layers 130 and 133 in the sub-pixel region 30 on the buffer layer 117, and may extend in the first direction D1. For example, the gate insulation layer 150 may be formed on the entire buffer layer 117. For example, the gate insulation layer 150 may sufficiently cover the first and second active layers 130 and 133 on the buffer layer 117, and may have a substantially flat upper surface without a step around the first and second active layers 130 and 133. Alternatively, the gate insulation layer 150 may at least partially cover the first and second active layers 130 and 133 on the buffer layer 117, and may be formed as a substantially uniform thickness along a profile of the first and second active layers 130 and 133. The gate insulation layer 150 may be formed using inorganic materials such as silicon compound, metal oxide, etc. For example, the gate insulation layer 150 may include SiOx, SiNx, SiOxNy, SiOxCy, SiCxNy, AlOx, AlNx, TaOx, HfOx, ZiOx, TiOx, etc.

A first gate electrode 170 may be formed in the sub-pixel region 30 on the gate insulation layer 150. For example, the first gate electrode 170 may be formed on the gate insulation layer 150 under which the first active layer 130 is located. The first gate electrode 170 may be formed using a metal, an alloy of a metal, metal nitride, conductive metal oxide, transparent conductive materials, etc. These may be used alone or in a suitable combination thereof. Alternatively, the first gate electrode 170 may have a multi-layered structure including a plurality of layers.

A second gate electrode 173 may be spaced apart from the first gate electrode 170 in the first direction D1 on the gate insulation layer 150. For example, the second gate electrode 173 may be formed on the gate insulation layer 150 under which the second active layer 133 is located. The second gate electrode 173 and the first gate electrode 170 may be simultaneously formed using the same materials. For example, after a second preliminary electrode layer is formed on the entire gate insulation layer 150, the first gate electrode 170 and the second gate electrode 173 may be formed by partially etching the second preliminary electrode layer. Alternatively, the second gate electrode 173 may have a multi-layered structure including a plurality of layers.

An insulating interlayer 190 may be formed on the gate insulation layer 150 and the first and second gate electrodes 170 and 173. The insulating interlayer 190 may at least partially cover the first and second gate electrodes 170 and 173 in the sub-pixel region 30 on the gate insulation layer 150, and may extend in the first direction D1. For example, the insulating interlayer 190 may be formed on the entire gate insulation layer 150. For example, the insulating interlayer 190 may sufficiently cover the first and second gate electrodes 170 and 173 on the gate insulation layer 150, and may have a substantially flat upper surface without a step around the first and second gate electrodes 170 and 173. Alternatively, the insulating interlayer 190 may at least partially cover the first and second gate electrodes 170 and 173 on the gate insulation layer 150, and may be formed as a substantially uniform thickness along a profile of the first and second gate electrodes 170 and 173. The insulating interlayer 190 may be formed using silicon compound, metal oxide, etc.

A first source electrode 210 and a first drain electrode 230 may be formed in the sub-pixel region 30 on the insulating interlayer 190. The first source electrode 210 may be in contact with a source region of the first active layer 130 via a contact hole formed by removing a first portion of the gate insulation layer 150 and the insulating interlayer 190, and the first drain electrode 230 may be in contact with a drain region of the first active layer 130 via a contact hole formed by removing a second portion of the gate insulation layer 150 and the insulating interlayer 190.

A second source electrode 213 and a second drain electrode 233 may be spaced apart from the first source and first drain electrodes 210 and 230 in the first direction D1 on the insulating interlayer 190. The second source electrode 213 may be in contact with a source region of the second active layer 133 via a contact hole formed by removing a third portion of the gate insulation layer 150 and the insulating interlayer 190. The second drain electrode 233 may be in contact with a drain region of the second active layer 133 via a contact hole formed by removing a fourth portion of the gate insulation layer 150 and the insulating interlayer 190.

Each of the first source and first drain electrodes 210 and 230 and the second source and second drain electrodes 213 and 233 may be formed using a metal, an alloy of a metal, metal nitride, conductive metal oxide, transparent conductive materials, etc. These may be used alone or in a suitable combination thereof. Alternatively, each of the first source and first drain electrodes 210 and 230 and the second source and second drain electrodes 213 and 233 may have a multi-layered structure including a plurality of layers.

Accordingly, a switching transistor 250 including the first active layer 130, the first gate electrode 170, the first source electrode 210, and the first drain electrode 230 may be formed, and a driving transistor 253 including the second active layer 133, the second gate electrode 173, the second source electrode 213, and the second drain electrode 233 may be formed. The switching transistor 250 may be spaced apart from the driving transistor 253. As described above, the switching transistor 250 may correspond to a third transistor TR3 of FIG. 2, and the driving transistor 253 may correspond to a first transistor TR1 of FIG. 2. For example, a second transistor TR2, fourth through seventh transistors TR4, TR5, TR6 and TR7, and a storage capacitor CST, etc. may be formed in a different cross-sectional view of the OLED display device.

A power supply wiring 380 may be formed in the peripheral region 20 on the insulating interlayer 190. According to exemplary embodiments of the present inventive concept, the power supply wiring 380 may be spaced apart from the first source and first drain electrodes 210 and 230 and the second source and second drain electrodes 213 and 233. As described above, a low power supply voltage ELVSS may be provided to the power supply wiring 380 (refer to FIG. 2). The power supply wiring 380, the first source and first drain electrodes 210 and 230, and the second source and second drain electrodes 213 and 233 may be simultaneously formed using the same materials. For example, after a third preliminary electrode layer is formed on the entire insulating interlayer 190, the power supply wiring 380, the first source and first drain electrodes 210 and 230, and the second source and second drain electrodes 213 and 233 may be formed by partially etching the third preliminary electrode layer. Alternatively, the power supply wiring 380 may have a multi-layered structure including a plurality of layers.

Figure 10:
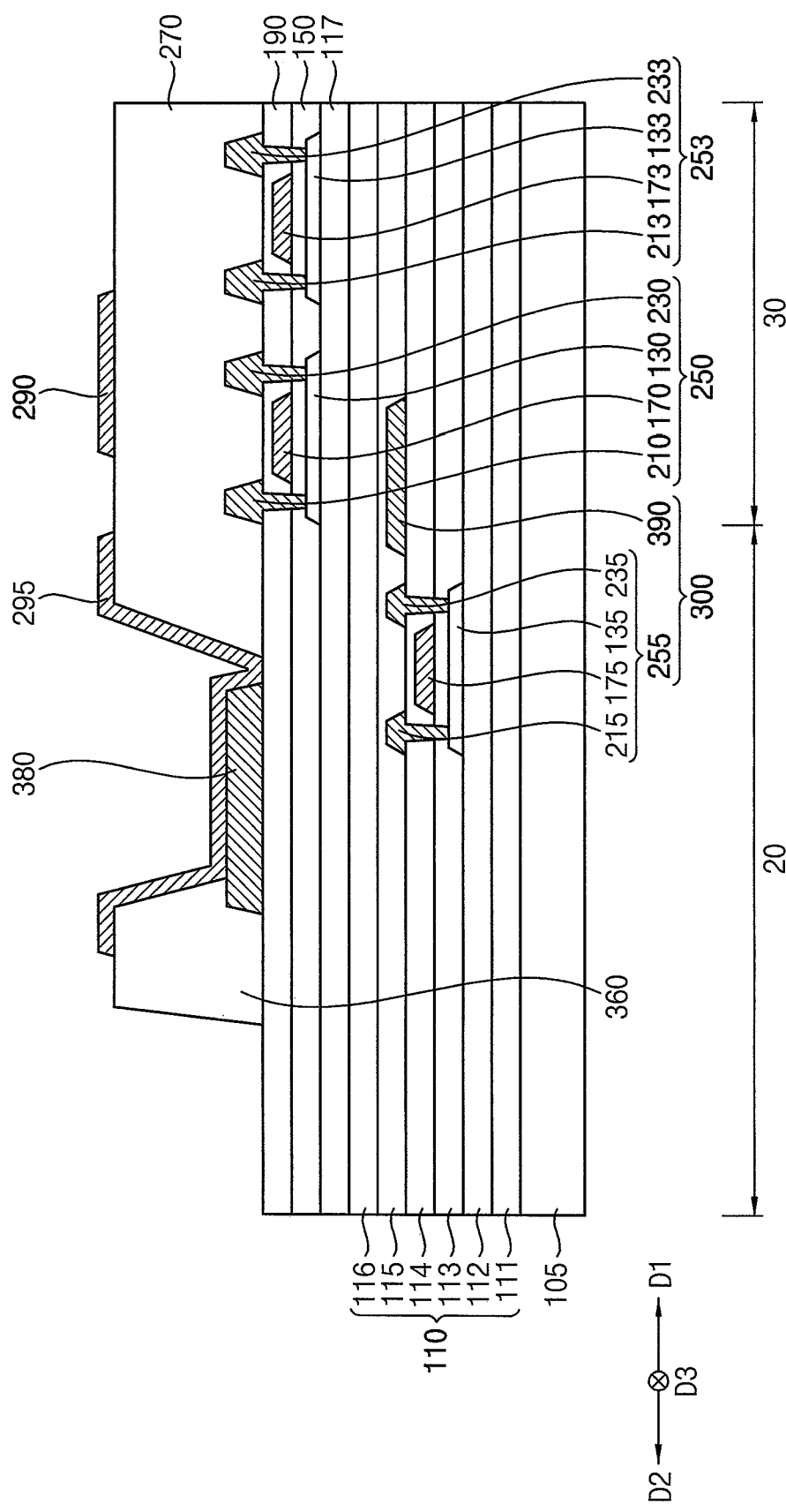

Referring to FIG. 10, a planarization layer 270 may be formed on the insulating interlayer 190, the power supply wiring 380, the first source and first drain electrodes 210 and 230, and the second source and second drain electrodes 213 and 233, and might not overlap the power supply wiring 380. The planarization layer 270 may be formed sufficiently thick so as to cover the power supply wiring 380, the first source and first drain electrodes 210 and 230, and the second source and second drain electrodes 213 and 233 on the insulating interlayer 190. In this case, the planarization layer 270 may have a substantially flat upper surface, and a planarization process may be further performed on the planarization layer 270 to implement the flat upper surface of the planarization layer 270. The planarization layer 270 may be formed using organic materials such as photoresist, polyacryl-based resin, polyimide-based resin, a polyamide-based resin, a siloxane-based resin, acryl-based resin, epoxy-based resin, etc.

A first sub-block pattern 360 may be formed in the peripheral region 20 on the insulating interlayer 190. The first sub-block pattern 360 may overlap a portion of the power supply wiring 380. The first sub-block pattern 360 may be located at a same layer with the planarization layer 270. The first sub-block pattern 360 and the planarization layer 270 may be simultaneously formed using the same materials. For example, after a first preliminary organic insulation layer is formed on the entire insulating interlayer 190, the first sub-block pattern 360 and the planarization layer 270 may be formed by partially removing the first preliminary organic insulation layer.

A lower electrode 290 may be formed in the sub-pixel region 30 on the planarization layer 270. For example, the lower electrode 290 may be formed using a metal, an alloy of a metal, metal nitride, conductive metal oxide, transparent conductive materials, etc. These may be used alone or in a suitable combination thereof. Alternatively, the lower electrode 290 may have a multi-layered structure including a plurality of layers.

A connection pattern 295 may be formed on a portion of the planarization layer 270, the power supply wiring 380, and a portion of an upper surface of the first sub-block pattern 360. For example, the connection pattern 295 may be spaced apart from the lower electrode 290 on the planarization layer 270, and may extend in a second direction D2 that is opposite to the first direction D1. In addition, the connection pattern 295 may be formed along a profile of the planarization layer 270, the power supply wiring 380, and the first sub-block pattern 360. The connection pattern 295 and the lower electrode 290 may be simultaneously formed using the same materials. For example, after a fourth preliminary electrode layer is formed on the insulating interlayer 190, the first sub-block pattern 360, the power supply wiring 380, and the planarization layer 270, the connection pattern 295 and the lower electrode 290 may be formed by partially removing the fourth preliminary electrode layer. Alternatively, the connection pattern 295 may have a multi-layered structure including a plurality of layers.

Figure 11:
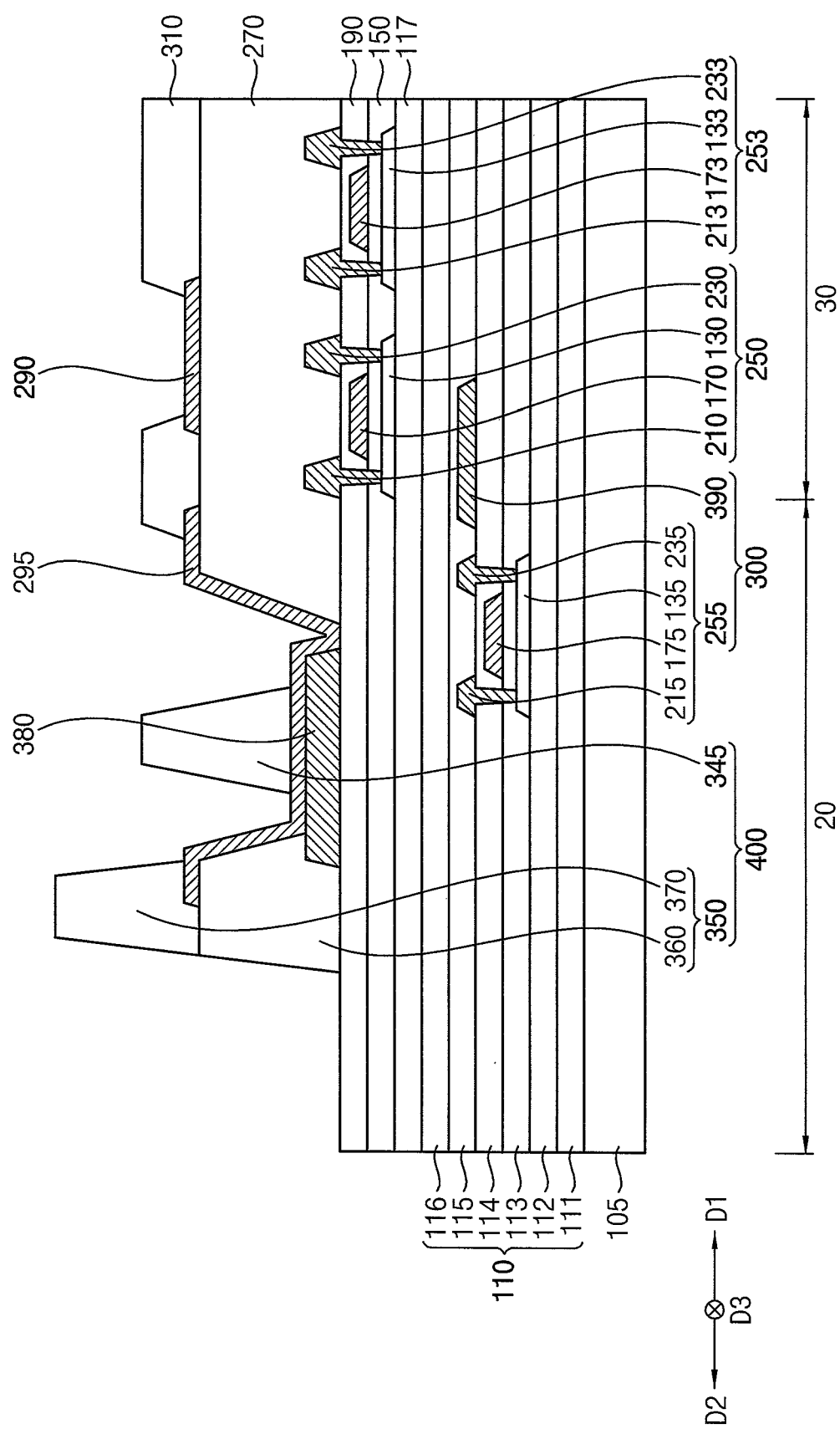

Referring to FIG. 11, a pixel defining layer 310 may be formed on a portion of the lower electrode 290, a portion of the connection pattern 295, and the planarization layer 270. The pixel defining layer 310 may at least partially cover both lateral portions of the lower electrode 290, and may have an opening that exposes a portion of an upper surface of the lower electrode 290. The pixel defining layer 310 may be formed using organic materials.

A first block pattern 345 may be formed in the peripheral region 20 on the connection pattern 295. For example, the first block pattern 345 may be formed on the connection pattern 295 under which the power supply wiring 380 is located. As illustrated in FIG. 1, the first block pattern 345 may at least partially surround the display region 10. The first block pattern 345 may be formed using organic materials.

A second sub-block pattern 370 may be formed on the first sub-block pattern 360 and a portion of the connection pattern 295. In addition, the second sub-block pattern 370 may be formed using organic materials. According to exemplary embodiments of the present inventive concept, the pixel defining layer 310, the first block pattern 345, and the second sub-block pattern 370 may be simultaneously formed using the same materials. For example, after a second preliminary organic layer is formed entirely on the insulating interlayer 190, the first sub-block pattern 360, the connection pattern 295, and the planarization layer 270, the pixel defining layer 310, the first block pattern 345, and the second sub-block pattern 370 may be formed by partially etching (e.g., an etch process using a half hone mask or a silt mask) the second preliminary organic layer.

Accordingly, a second block pattern 350 including the first sub-block pattern 360 and the second sub-block pattern 370 may be formed. As illustrated in FIG. 1, the second block pattern 350 may be spaced apart from the first block pattern 345, and may at least partially surround the first block pattern 345. A height of the second block pattern 350 may be greater than a height of the first block pattern 345. In addition, the first block pattern 345 and the second block pattern 350 may be defined as a block structure 400.

Figure 12:
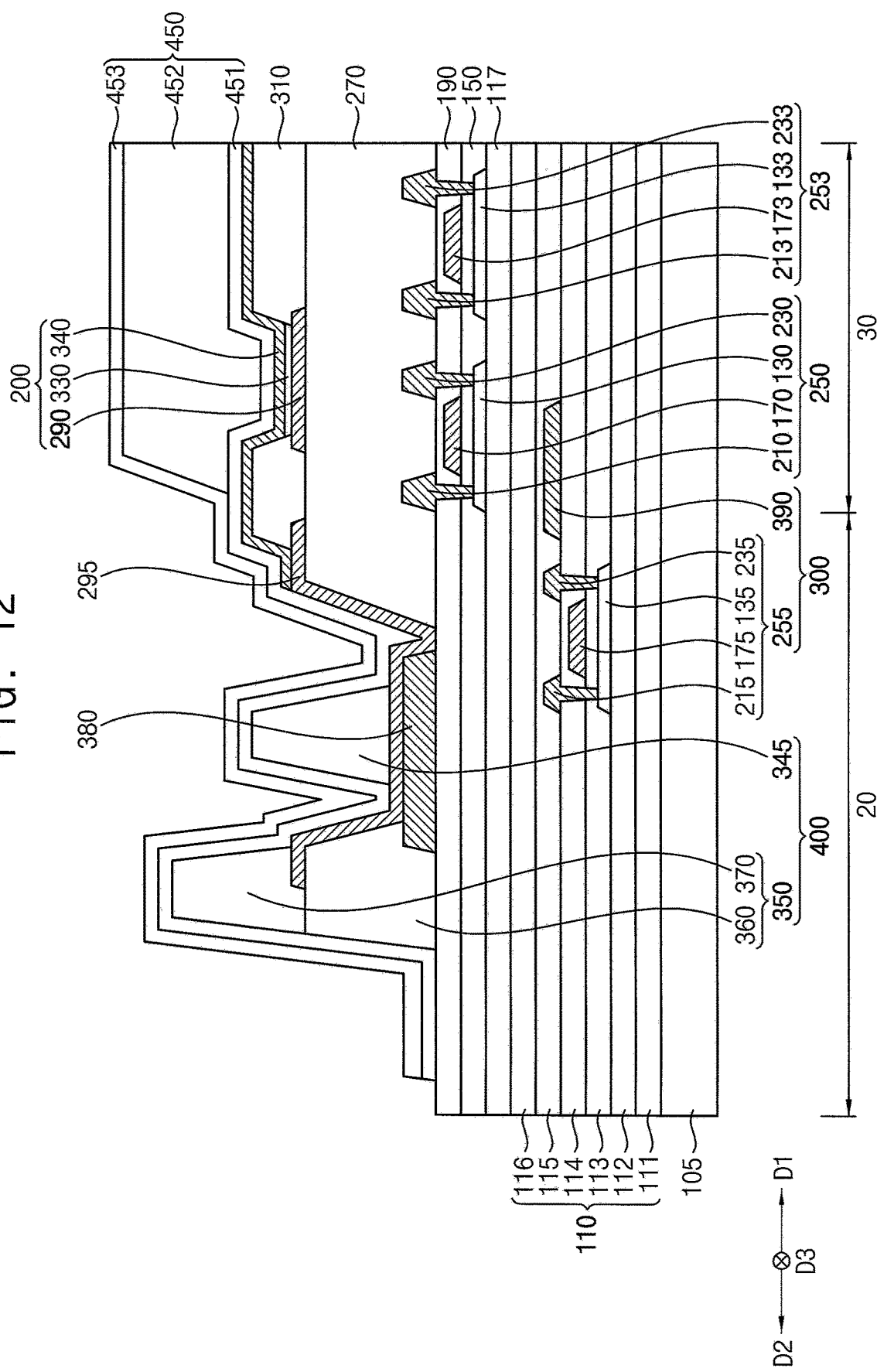

Referring to FIG. 12, a light emitting layer 330 may be formed on the lower electrode 290 exposed by the opening of the pixel defining layer 310. The light emitting layer 330 may be formed using at least one of light emitting materials capable of generating different colors of light (e.g., red, blue, and green, etc.) according to sub-pixels. Alternatively, the light emitting layer 330 may generally generate white light by stacking a plurality of light emitting materials capable of generating different colors of light such as red, green, blue, etc. In this case, a color filter may be formed on the light emitting layer 330. The color filter may include a red color filter, a green color filter, and/or a blue color filter. Alternatively, the color filter may include a yellow color filter, a cyan color filter, and a magenta color filter. The color filter may include a photosensitive resin, a color photoresist, etc.

An upper electrode 340 may be formed on the pixel defining layer 310 and the light emitting layer 330. The upper electrode 340 may at least partially cover the light emitting layer 330 and the pixel defining layer 310, and may be formed on the entire substrate 110. According to exemplary embodiments of the present inventive concept, the upper electrode 340 may at least partially cover the light emitting layer 330 and extend in the first direction D1, and may be electrically connected to the connection pattern 295. The upper electrode 340 may be formed using a metal, a metal alloy, metal nitride, conductive metal oxide, transparent conductive materials, etc. These may be used alone or in a suitable combination thereof. Alternatively, the upper electrode 340 may have a multi-layered structure including a plurality of layers. Accordingly, a sub-pixel structure 200 including the lower electrode 290, the light emitting layer 330, and the upper electrode 340 may be formed.

A first TFE layer 451 may be formed on the upper electrode 340, the connection pattern 295, the block structure 400, and the insulating interlayer 190. The first TFE layer 451 may at least partially cover the upper electrode 340, the connection pattern 295, and the block structure 400, and may be formed as a substantially uniform thickness along a profile of the upper electrode 340, the connection pattern 295, and the block structure 400. The first TFE layer 451 may prevent the sub-pixel structure 200 from being deteriorated by the permeation of moisture, water, oxygen, etc. In addition, the first TFE layer 451 may protect the sub-pixel structure 200 from external impacts. The first TFE layer 451 may be formed using flexible inorganic materials.

A second TFE layer 452 may be formed on the first TFE layer 451. The second TFE layer 452 may increase the flatness of the OLED display device, and may protect the sub-pixel structure 200. The second TFE layer 452 may be formed using flexible organic materials.

A third TFE layer 453 may be formed on the second TFE layer 452. The third TFE layer 453 may at least partially cover the second TFE layer 452, and may be formed as a substantially uniform thickness along a profile of the second TFE layer 452. The third TFE layer 453 together with the first TFE layer 451 and the second TFE layer 452 may prevent the sub-pixel structure 200 from being deteriorated by the permeation of moisture, water, oxygen, etc. In addition, the third TFE layer 453 together with the first TFE layer 451 and the second TFE layer 452 may protect the sub-pixel structure 200 from external impacts. The third TFE layer 453 may be formed using flexible inorganic materials. Accordingly, a TFE structure 450 including the first TFE layer 451, the second TFE layer 452, and the third TFE layer 453 may be formed. Alternatively, the TFE structure 450 may have five layers structure where first through fifth TFE layers are stacked or seven layers structure where the first through seventh TFE layers are stacked. After the TFE structure 450 is formed, the rigid glass substrate 105 may be removed from the substrate 110.

Accordingly, an OLED display device 100 illustrated in FIG. 3 may be manufactured.

Figure 13:
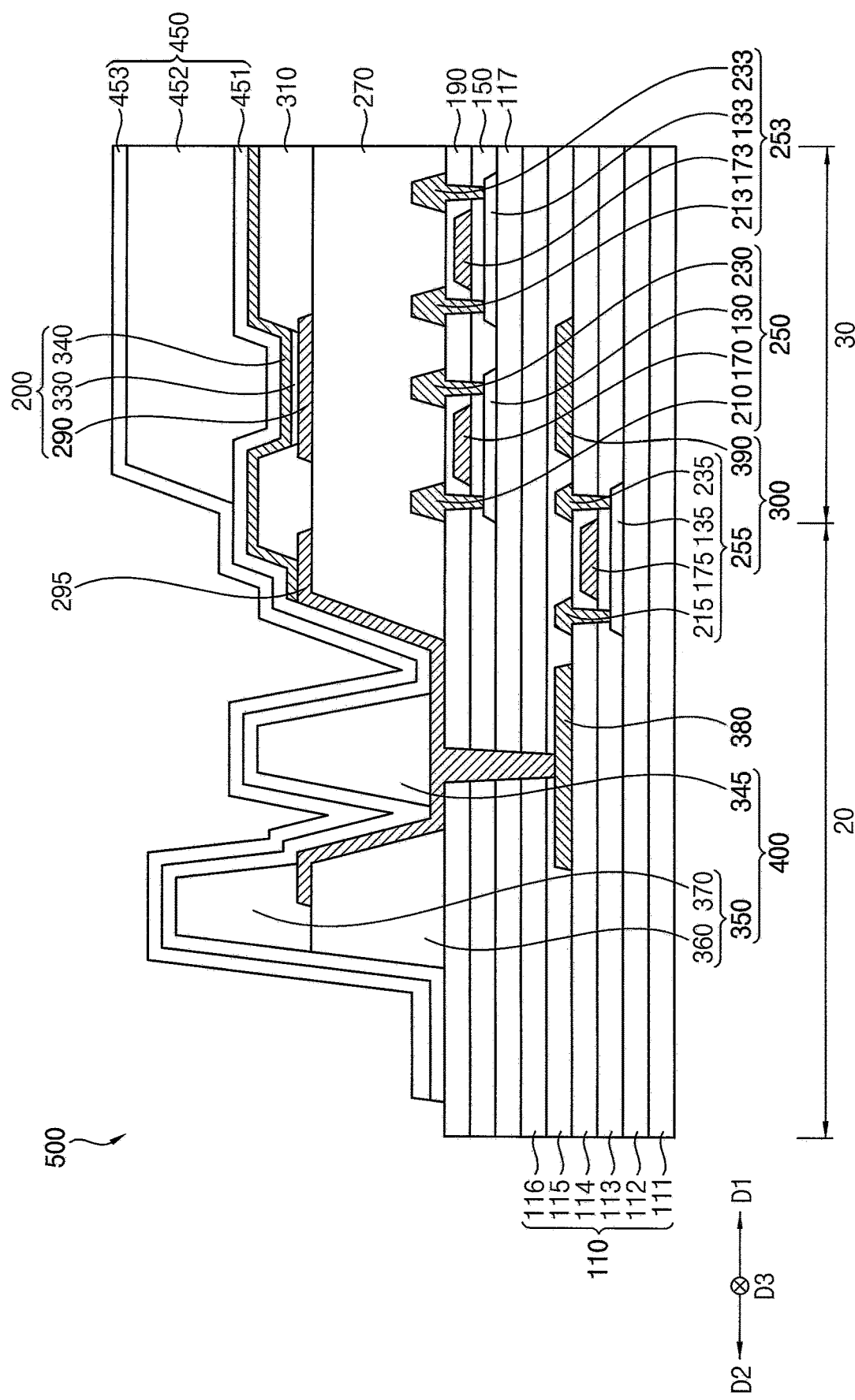
FIG. 13 is a cross-sectional view illustrating an OLED display device in accordance with exemplary embodiments of the present inventive concept.
Figure 14:
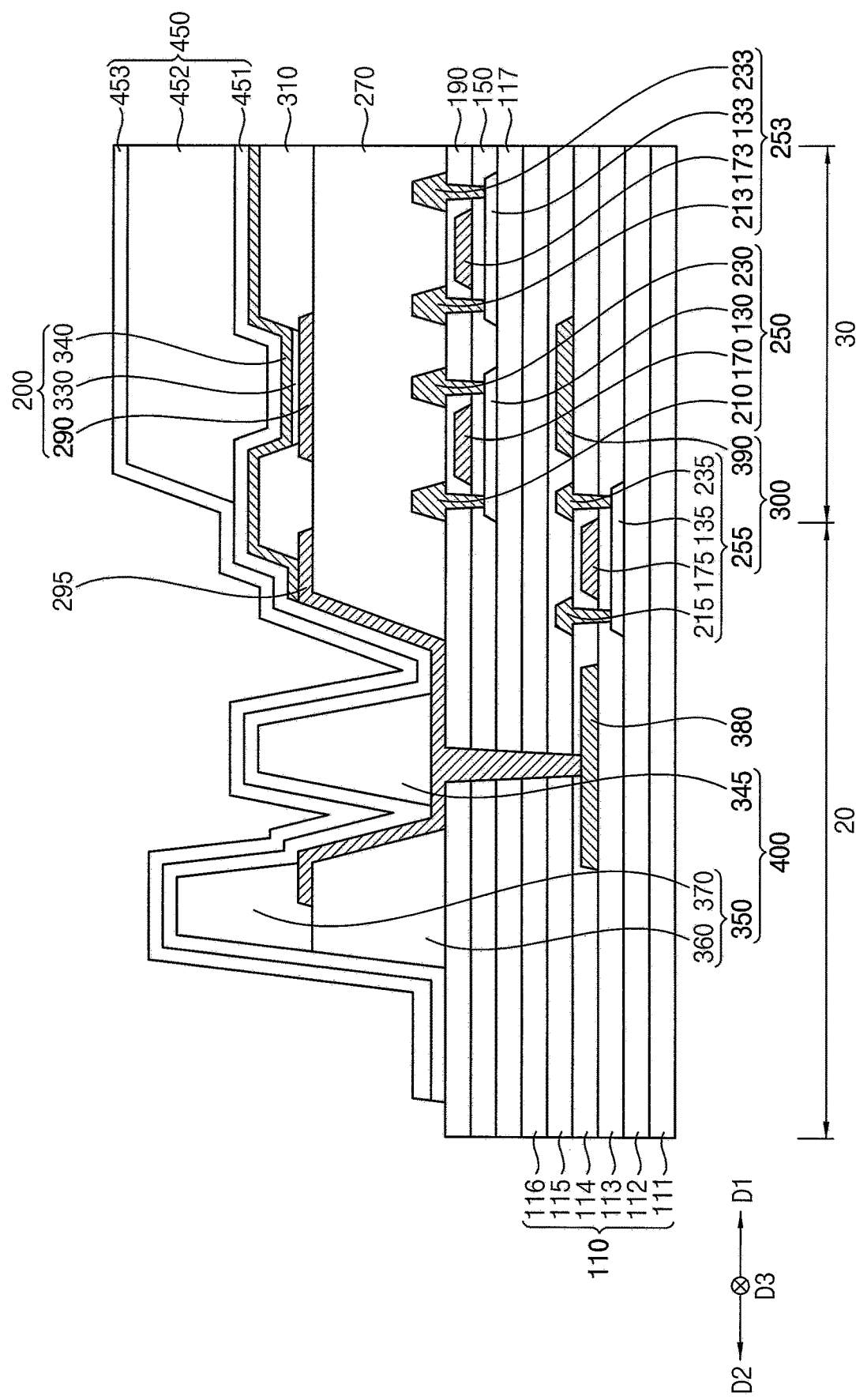
FIG. 14 is a cross-sectional view illustrating an example of the OLED display device of FIG. 13.
Figure 15:
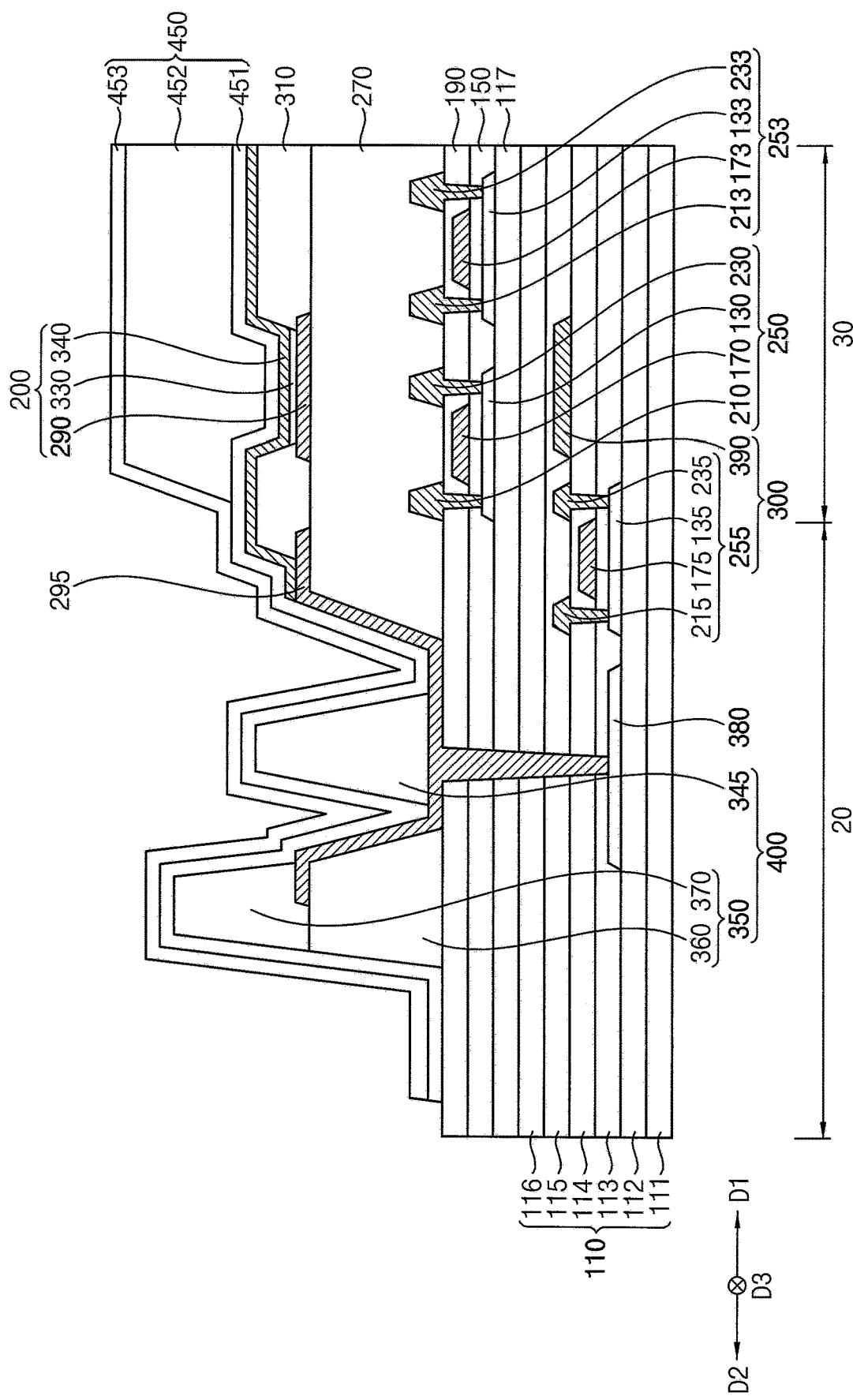
FIG. 15 is a cross-sectional view illustrating an example of the OLED display device of FIG. 13.

FIG. 13 is a cross-sectional view illustrating an OLED display device in accordance with exemplary embodiments of the present inventive concept, and FIG. 14 is a cross-sectional view illustrating an example of the OLED display device of FIG. 13. FIG. 15 is a cross-sectional view illustrating an example of the OLED display device of FIG. 13. An OLED display device 500 illustrated in FIG. 13 may have a configuration substantially the same as or similar to that of an OLED display device 100 described with reference to FIGS. 1 through 3 except for a shape of connection pattern 295. In FIG. 13, detailed descriptions for elements that are substantially the same as or similar to elements described with reference to FIGS. 1 and 2 might not be repeated, and it may be assumed that those elements that are not described in detail below may be at least similar to corresponding elements that have already been described.

Referring to FIG. 13, an OLED display device 500 may include a substrate 110, a circuit structure 300, a buffer layer 117, a gate insulation layer 150, an insulating interlayer 190, a switching transistor 250, a driving transistor 253, a power supply wiring 380, a planarization layer 270, a block structure 400, a sub-pixel structure 200, a connection pattern 295, a pixel defining layer 310, a TFE structure 450, etc. Here, the substrate 110 may include a first organic layer 111, a first barrier layer 112, a second barrier layer 113, a third barrier layer 114, a second organic layer 115, and a fourth barrier layer 116.

The power supply wiring 380 may be disposed in the peripheral region 20 on the third barrier layer 114. The power supply wiring 380 may be spaced apart from the source electrode pattern 215, the drain electrode pattern 235, and the initialization voltage wiring 390. A low power supply voltage ELVSS may be provided to the power supply wiring 380 (refer to FIG. 2). Here, the low power supply voltage ELVSS may be applied to the upper electrode 340. For example, the power supply wiring 380 may include a metal, an alloy of a metal, metal nitride, conductive metal oxide, transparent conductive materials, etc. These may be used alone or in a suitable combination thereof. Alternatively, the power supply wiring 380 may have a multi-layered structure including a plurality of layers. According to exemplary embodiments of the present inventive concept, the power supply wiring 380, the source electrode pattern 215, the drain electrode pattern 235, and the initialization voltage wiring 390 may be simultaneously formed using same materials.

The connection pattern 295 may be disposed in the peripheral region 20 on a portion of the planarization layer 270, a portion of the insulating interlayer 190, and a portion of an upper surface of the first sub-block pattern 360. For example, the connection pattern 295 may be spaced apart from the lower electrode 290 on the planarization layer 270, and may extend in a second direction D2 that is opposite to the first direction D1. In addition, the connection pattern 295 may be disposed along a profile of the insulating interlayer 190 and the first sub-block pattern 360. The connection pattern 295 may be interposed between the first block pattern 345 and the insulating interlayer 190 in the peripheral region 20, and a portion of the connection pattern 295 may be interposed between the first sub-block pattern 360 and the second sub-block pattern 370. Alternatively, the connection pattern 295 might not be disposed on the upper surface of the first sub-block pattern 360. The connection pattern 295 may electrically connect the power supply wiring 380 and the upper electrode 340, and may receive the low power supply voltage ELVSS from the power supply wiring 380. The low power supply voltage ELVSS may be applied to the upper electrode 340 through the connection pattern 295. According to exemplary embodiments of the present inventive concept, the connection pattern 295 may be in contact with the power supply wiring 380 via a contact hole formed by removing a portion of the insulating interlayer 190, the gate insulation layer 150, the buffer layer 117, the fourth barrier layer 116, and the second organic layer 115. The connection pattern 295 may include a metal, an alloy of a metal, metal nitride, conductive metal oxide, transparent conductive materials, etc. These may be used alone or in a suitable combination thereof. Alternatively, the connection pattern 295 may have a multi-layered structure including a plurality of layers. According to exemplary embodiments of the present inventive concept, the lower electrode 290 and the connection pattern 295 may be simultaneously formed using the same materials.

The circuit structure 300 and the power supply wiring 380 according to exemplary embodiments of the present inventive concept may be buried in an interior of the substrate 110. In this case, as a distance between the connection pattern 295 and the switching transistor 250 is reduced, a dead space of the OLED display device 500 may be relatively decreased. Accordingly, the OLED display device 500 may reduce a width of a bezel corresponding to a non-display region and increase an area of the display region 10.

According to an exemplary embodiment of the present inventive concept, as illustrated in FIG. 14, the power supply wiring 380 and the gate electrode pattern 175 may be simultaneously formed at a same layer by using the same materials. The connection pattern 295 may be in contact with the power supply wiring 380 via contact hole formed by removing a portion of the insulating interlayer 190, the gate insulation layer 150, the buffer layer 117, the fourth barrier layer 116, the second organic layer 115, and the third barrier layer 114.

According to an exemplary embodiment of the present inventive concept, as illustrated in FIG. 15, the power supply wiring 380 and the active pattern 135 may be simultaneously formed at a same layer by using the same materials. The connection pattern 295 may be in contact with the power supply wiring 380 via a contact hole formed by removing a portion of the insulating interlayer 190, the gate insulation layer 150, the buffer layer 117, the fourth barrier layer 116, the second organic layer 115, the second third barrier layer 114, and the second barrier layer 113.

The present invention may be applied to various display devices including an OLED display device. For example, the present invention may be applied to vehicle-display device, a ship-display device, an aircraft-display device, portable communication devices, display devices for display or for information transfer, a medical-display device, etc.

The foregoing is illustrative of exemplary embodiments of the present inventive concept. Although a few exemplary embodiments of the present inventive concept have been described, those skilled in the art will readily appreciate that many modifications are possible in the example embodiments without materially departing from the novel teachings and aspects of the present inventive concept. Accordingly, all such modifications are intended to be included within the scope of the present inventive concept.

What is claimed is:

1. An organic light emitting diode ("OLED") display device, comprising:
   a substrate including: a display region including a plurality of sub-pixel regions; and a peripheral region at least partially surrounding the display region;
   a sub-pixel structure in each of the plurality of sub-pixel regions on the substrate; and
   a circuit structure disposed within the substrate in the sub-pixel region, and located adjacent to the peripheral region,
   wherein a portion of the circuit structure overlaps the sub-pixel structure.

2. The OLED display device of claim 1, wherein the substrate includes a plurality of layers, and the circuit structure is interposed between two of the plurality of layers.

3. The OLED display device of claim 1, further comprising:
   a switching transistor disposed in the sub-pixel region on the substrate; and
   a driving transistor spaced apart from the switching transistor.

4. The OLED display device of claim 3, wherein the circuit structure and the switching and driving transistors are located on different layers.

5. The OLED display device of claim 3, wherein the circuit structure partially overlaps the switching transistor or the driving transistor.

6. The OLED display device of claim 3, wherein the substrate includes:
   a first organic layer;
   a first barrier layer disposed on the first organic layer;
   a second barrier layer disposed on the first barrier layer;
   a third barrier layer disposed on the second barrier layer;
   a second organic layer disposed on the third barrier layer; and
   a fourth barrier layer disposed on the second organic layer.

7. The OLED display device of claim 6, wherein the circuit structure includes:
   a gate driving unit; and
   an initialization voltage wiring spaced apart from the gate driving unit.

8. The OLED display device of claim 7, wherein the gate driving unit provides a gate signal to the switching transistor, and the initialization voltage wiring provides an initialization voltage to the driving transistor.

9. The OLED display device of claim 7, wherein the gate driving unit includes:
   an active pattern disposed on the first barrier layer;
   a gate electrode pattern disposed on the second barrier layer, the gate electrode pattern overlapping a first portion of the active pattern; and
   source and drain electrode patterns disposed on the third barrier layer, the source and drain electrode patterns overlapping a second portion of the active pattern.

10. The OLED display device of claim 1, further comprising:
    a power supply wiring disposed in the peripheral region on the substrate; and
    a connection pattern disposed on the power supply wiring.

11. The OLED display device of claim 10, wherein the power supply wiring is electrically connected to the sub-pixel structure through the connection pattern.

12. The OLED display device of claim 1, further comprising:
    a power supply wiring disposed within the substrate in the peripheral region thereof, the power supply wiring being spaced apart from the circuit structure; and
    a connection pattern disposed on the power supply wiring, wherein the power supply wiring is electrically connected to sub-pixel structure through the connection pattern.

13. The OLED display device of claim 12, wherein the power supply wiring and the circuit structure are located at a same layer.

14. The OLED display device of claim 12, wherein the sub-pixel structure includes:
    a lower electrode disposed on the substrate;
    a light emitting layer disposed on the lower electrode; and
    an upper electrode disposed on the light emitting layer,
    wherein the upper electrode is electrically connected to the connection pattern.

15. An OLED display device, comprising:
    a substrate including: a display region including a plurality of sub-pixel regions; and a peripheral region at least partially surrounding the display region;
    a sub-pixel structure disposed within each of the plurality of sub-pixel regions on the substrate;
    a circuit structure disposed within the substrate in the sub-pixel region, and located adjacent to the peripheral region;
    a power supply wiring disposed in the peripheral region on the substrate;
    a connection pattern disposed on the power supply wiring; and
    a block structure disposed in the peripheral region on the substrate.

16. The OLED display device of claim 15, wherein the block structure includes:
    a first block pattern disposed on the connection pattern; and
    a second block pattern spaced apart from the first block pattern, the second block pattern at least partially surrounding the first block pattern.

17. The OLED display device of claim 16, wherein the block structure partially overlaps the power supply wiring.

18. The OLED display device of claim 16, wherein the power supply wiring partially overlaps the circuit structure.

19. The OLED display device of claim 16, wherein the circuit structure partially overlaps the sub-pixel structure.

* * * * *